US009500442B2

(12) United States Patent
Collin et al.

(10) Patent No.: US 9,500,442 B2
(45) Date of Patent: Nov. 22, 2016

(54) HOLOGRAPHIC GUN SIGHT

(71) Applicant: OptiFlow, Inc., Ann Arbor, MI (US)

(72) Inventors: Fred Collin, Brighton, MI (US); Kurt Douglas Mills, Stockbridge, MI (US); (Continued)

(73) Assignee: OptiFlow, Inc., Ann Arbor, MI (US)

( * ) Notice: Subject to any disclaimer, the term of this patent is extended or adjusted under 35 U.S.C. 154(b) by 32 days.

(21) Appl. No.: 14/331,925

(22) Filed: Jul. 15, 2014

(65) Prior Publication Data
US 2015/0267997 A1 Sep. 24, 2015

Related U.S. Application Data

(60) Provisional application No. 62/005,262, filed on May 30, 2014, provisional application No. 61/883,532, (Continued)

(51) Int. Cl.
*G03H 1/00* (2006.01)
*F41G 1/34* (2006.01)
(Continued)

(52) U.S. Cl.
CPC ............... *F41G 1/345* (2013.01); *G02B 23/10* (2013.01); *G02B 27/0189* (2013.01); (Continued)

(58) Field of Classification Search
CPC ............ G02B 27/0149; G02B 27/0103; G02B 27/0189; G02B 2027/015; G02B (Continued)

(56) References Cited

U.S. PATENT DOCUMENTS 5,020,892 A 6/1991 Glover et al.
5,483,362 A 1/1996 Tai et al.
(Continued)

FOREIGN PATENT DOCUMENTS

EP 1154284 A1 11/2001
WO WO-0050836 A1 8/2000
(Continued)

OTHER PUBLICATIONS

International Search Report and Written Opinion for co-pending application No. PCT/US2014/046692, filed Jul. 15, 2014.
(Continued)

*Primary Examiner* — Stephone B Allen
*Assistant Examiner* — Jyotsna Dabbi
(74) *Attorney, Agent, or Firm* — Dinsmore & Shohl LLP; Douglas L. Wathen

(57) ABSTRACT

A sight assembly for mounting to a weapon is provided. A holographic optical element and a light source are provided in a fixed angular configuration with respect to one another, but may be adjusted either together or individually in a horizontal or vertical direction. A mirror or lens may also be provided. An adjustment mechanism is provided where a shaft includes at least two portions wherein the two portions of the shaft of the screw have different pitch directions and/or pitch dimensions allowing for slight adjustment of the assembly. The light source is typically a vertical-cavity surface emitting laser (VCSEL). The wavelength of the VCSEL is controlled by controlling the current it is given. The assembly further allows for perceived image distance adjustment using parallax mismatch. Further, a chassis is provided for holding holographic elements.

43 Claims, 21 Drawing Sheets

(72) Inventors: David S. Dilworth, Ann Arbor, MI (US); Rod Collin, Saline, MI (US); Stephen Michael Shubeck, Ann Arbor, MI (US); Christopher Stephen Hyde, Clarkston, MI (US)

Related U.S. Application Data filed on Sep. 27, 2013, provisional application No. 61/879,393, filed on Sep. 18, 2013, provisional application No. 61/846,251, filed on Jul. 15, 2013.

(51) Int. Cl.
*G03H 1/22* (2006.01)
*G02B 23/10* (2006.01)
*G02B 27/01* (2006.01)

(52) U.S. Cl.
CPC .............. *G03H 1/0005* (2013.01); *G03H 1/22* (2013.01); *G03H 1/2249* (2013.01); *G03H 2001/2247* (2013.01); *G03H 2001/2252* (2013.01); *G03H 2001/2284* (2013.01); *G03H 2227/03* (2013.01); *G03H 2227/06* (2013.01)

(58) Field of Classification Search
CPC .................... 2027/019–2027/0196;G03H 1/00; G03H 1/02; G03H 1/0005; G03H 2001/0232; G03H 1/22; G03H 2001/2284; G03H 2001/0212; G03H 2001/2247; G03H 2001/2252; G03H 2227/06; G03H 2227/03; F41G 1/473; F41G 1/38; F41G 1/545; F41G 1/54; F41G 1/383; F41G 1/04; F41G 1/02; F41G 1/32; F41G 1/35; F41G 1/065; F41G 1/345; F41G 11/00; F41G 11/003; F41G 11/001; F41G 11/008; F41G 3/00; F41G 3/005; F41G 3/02; F41G 3/08; F41G 5/00; F41A 27/00
See application file for complete search history.

(56) References Cited

U.S. PATENT DOCUMENTS

| | | | |
|---|---|---|---|
| 5,706,600 A | 1/1998 | Toole et al. | |
| 5,754,574 A | 5/1998 | Lofthouse-Zeis et al. | |
| 5,784,182 A | 7/1998 | Francoeur et al. | |
| 5,815,936 A * | 10/1998 | Sieczka et al. | 42/115 |
| 6,101,200 A | 8/2000 | Burbidge et al. | |
| 6,654,152 B2 | 11/2003 | Jacobowitz et al. | |
| 6,738,187 B2 | 5/2004 | DeCusatis et al. | |
| 6,751,014 B2 | 6/2004 | DeCusatis et al. | |
| 6,947,458 B2 | 9/2005 | Moriarty et al. | |
| 7,190,904 B2 | 3/2007 | DeCusatis et al. | |
| 7,356,057 B2 | 4/2008 | Deng et al. | |
| 7,542,189 B2 | 6/2009 | Tanimura et al. | |
| 8,208,507 B2 | 6/2012 | Lerner et al. | |
| 8,233,209 B2 | 7/2012 | Miyatake et al. | |
| 8,235,605 B2 | 8/2012 | Kim | |
| 8,345,719 B2 | 1/2013 | Moench et al. | |
| 8,559,821 B2 | 10/2013 | Wen et al. | |
| 8,578,646 B2 | 11/2013 | Joannes | |
| 8,605,763 B2 | 12/2013 | Castillo et al. | |
| 8,607,495 B2 | 12/2013 | Moore et al. | |
| 8,638,387 B2 | 1/2014 | Aizpuru et al. | |
| 8,739,454 B2 | 6/2014 | Erdle et al. | |
| 8,756,852 B2 | 6/2014 | Kramer et al. | |
| 8,833,655 B2 | 9/2014 | McCarty et al. | |
| 8,837,877 B2 | 9/2014 | Kimerling et al. | |
| 8,850,950 B2 | 10/2014 | Deckard et al. | |
| 8,879,146 B2 | 11/2014 | LoRocco et al. | |
| 8,887,430 B2 | 11/2014 | Wichner | |
| 8,888,491 B2 | 11/2014 | Carter | |
| 2005/0073690 A1 * | 4/2005 | Abbink | G01J 9/02 356/451 |
| 2005/0082553 A1 | 4/2005 | Yamamoto et al. | |
| 2005/0188583 A1 | 9/2005 | Jackson et al. | |
| 2005/0225853 A1 | 10/2005 | Hakansson et al. | |
| 2006/0022213 A1 | 2/2006 | Posamentier | |
| 2006/0182441 A1 | 8/2006 | Kish et al. | |
| 2008/0010841 A1 * | 1/2008 | Gordon | F41G 1/467 33/265 |
| 2008/0031294 A1 | 2/2008 | Krishnamoorthy et al. | |
| 2011/0031903 A1 | 2/2011 | Nguyen Hoang et al. | |
| 2011/0129227 A1 | 6/2011 | Wen et al. | |
| 2011/0164633 A1 | 7/2011 | Moench et al. | |
| 2011/0228803 A1 | 9/2011 | Guenter et al. | |
| 2014/0026464 A1 | 1/2014 | Wiklund | |
| 2014/0056322 A1 | 2/2014 | Castillo et al. | |
| 2014/0109457 A1 | 4/2014 | Speroni | |
| 2014/0130395 A1 | 5/2014 | Scroggins | |
| 2014/0160475 A1 | 6/2014 | Kingsbury et al. | |
| 2014/0169390 A1 | 6/2014 | Spiekermann | |
| 2014/0238429 A1 | 8/2014 | Mizuno et al. | |
| 2014/0268323 A1 | 9/2014 | Feinberg | |
| 2014/0283431 A1 | 9/2014 | Tuller, Jr. et al. | |
| 2014/0290113 A1 | 10/2014 | Thomas et al. | |
| 2014/0290114 A1 | 10/2014 | Thomas et al. | |
| 2014/0295380 A1 | 10/2014 | Amis et al. | |
| 2014/0305022 A1 | 10/2014 | Chung | |
| 2014/0305023 A1 | 10/2014 | Moore et al. | |
| 2014/0305025 A1 | 10/2014 | Tubb | |
| 2014/0315156 A1 | 10/2014 | Averill | |
| 2014/0319217 A1 | 10/2014 | Elefante | |
| 2014/0334058 A1 | 11/2014 | Galvan et al. | |

FOREIGN PATENT DOCUMENTS

| | | | |
|---|---|---|---|
| WO | WO-2007011803 A2 | 1/2007 | |
| WO | WO 2009044387 A2 * | 4/2009 | G01H 9/00 |
| WO | WO-2014056105 A2 | 4/2014 | |

OTHER PUBLICATIONS

Chhajed, S. et al., "Junction temperature in light-emitting diodes assessed by different methods," Proc. SPIE 5739, Light-Emitting Diodes: Research, Manufacturing, and Applications IX, 16 (Mar. 25, 2005); doi:10.1117/12.593696.

Fukada, M. et al., "Temperature and current coefficients of lasing wavelength in tunable diode laser spectroscopy," App. Phys B., Aug. 2010; 100(2): 377-382.

Chonko, J. et al., "Using Forward Voltage to Measure Semiconductor Junction Temperature," Keithley Instruments, Inc., Cleveland, Ohio, Feb. 2006, pp. 1-3.

* cited by examiner

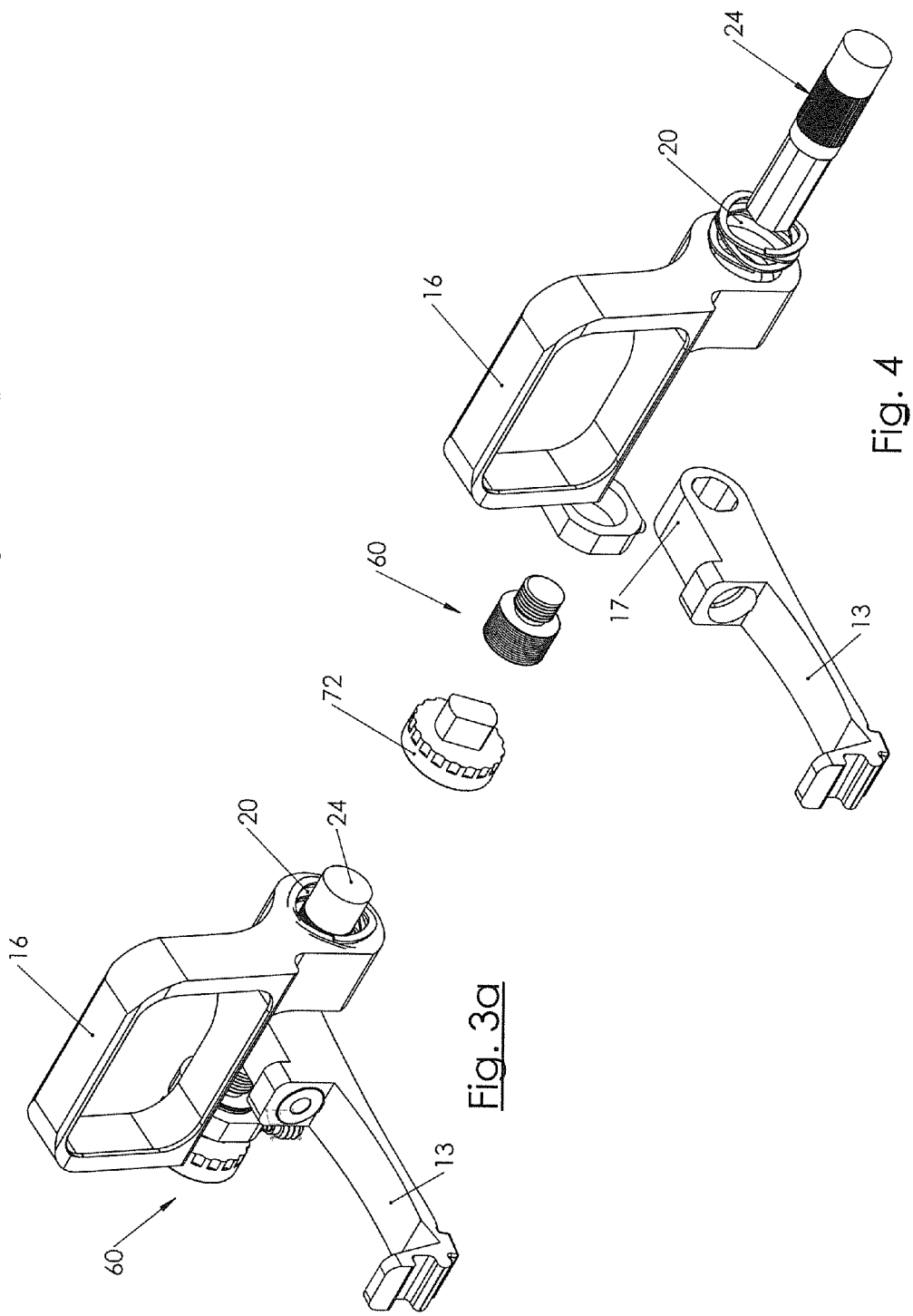

WINDAGE ADJUSTMENT (MOVEABLE DIODE)

Elevation Adjustment

HOLOGRAPHIC GUN SIGHT

CROSS-REFERENCE TO RELATED APPLICATIONS

This utility patent application claims priority from U.S. provisional patent application Ser. No. 61/879,393, filed Sep. 18, 2013, the entire content of which is incorporated herein in its entirety, U.S. provisional patent application Ser. No. 61/846,251, filed Jul. 15, 2013, the entire content of which is incorporated herein in its entirety, U.S. provisional patent application Ser. No. 61/883,532, filed Sep. 27, 2013, the entire content of which is incorporated herein in its entirety, and U.S. provisional patent application Ser. No. 62/005,262, filed May 30, 2014, the entire content of which is incorporated herein in its entirety.

FIELD OF THE INVENTION

The present disclosure relates to a holographic image apparatus for use with a weapon.

BACKGROUND OF THE INVENTION

Holographic gun sights are well known, but typical designs are complex and may be bulky or have high energy usage. Adjusting a holographic gun sight for windage and elevation has also presented challenges. Adjustment is required to align the positioning of the reconstructed reticle and to compensate for various weapon types and targeting procedures. Existing systems have drawbacks. Accordingly there exists a need in the art to provide alternative or improved designs for holographic gun sights.

Specifically, laser diodes are used in a wide variety of applications that require a narrow spectral width. However, the wavelengths of the light produced by the laser diode vary depending on a number of factors, including the temperature of the laser diode. For example, some laser diodes will exhibit a shift in output wavelength of approximately 0.30 nm/° C. The change in temperature of the laser diode may be due to environmental conditions or due to heating from operation of the diode. For some applications, this shift in wavelength is not a problem. However, for other applications, such as the holographic gun sight, this shift in wavelength will cause the holographic gun sight to be inaccurate.

In a holographic gun sight the hologram reconstructs an image of a reticle which will appear in focus at a distance in the viewing field (Virtual Image Plane). The sight is designed so that this image will overlap the target. Holographic diffractive optics are wavelength dependent, thus very sensitive to changes in laser diode wavelength changes. As the wavelength of the light shifts, the diffraction angle from a holographic element will change, which will result in movement of the projected holographic image and give an inaccurate reticle position relative to the target.

To correct for this change in wavelength some sights are configured such that the system of holographic elements are achromatic and compensate for changes in wavelength. However, it remains desirable (simpler design, easier manufacturing, more reliable, lower cost) to provide a source of laser-light in which the output wavelength is stable as the temperature changes within an operating range. Similar considerations apply to other devices utilizing laser light such as stable LED, RCLED . . . etc.

One approach to addressing this problem is to control the temperature of the laser diode, such as through the use of a thermoelectric device or TEC cooler. Such control may be open or closed loop. An open loop control may be used, such as a temperature sensor attached to the laser diode. As the sensor temperature changes the TEC cooler will be adjusted to keep the diode at one stable temperature. For a closed loop system the wavelength output by the laser diode may be directly monitored by a device such as a grating. This information is then used to adjust the temperature of the laser diode via the thermoelectric cooler, and bring the diode back to the target wavelength. While thermal control of the laser diode is effective in preventing a change in wavelength, thermoelectric controllers are large in comparison to the laser diode and may draw a current in excess of 0.5 amps. For either case using a thermoelectric cooler increases the physical size of the laser source assembly and greatly increases its energy requirements. For this reason thermoelectric controllers in gun sights are impractical and undesirable at this time. By way of example, US Patent Application Publication No. 2014/0064315 discloses another means for incorporating a thermoelectric controller in a gun sight.

An alternative type of semiconductor laser diode is known as a VCSEL, or vertical-cavity surface-emitting laser. A VCSEL has improved temperature stability as compared to a standard laser diode. For example, a VCSEL may have a wavelength shift of approximately 0.05 nm/° C., which is approximately a six-fold improvement over a standard laser diode. While this is a large improvement over the standard laser diode, even this smaller amount of wavelength shift will be enough to impair the accuracy of the device.

Parallax mismatch is an undesired result of using holography for target shooting. Parallax mismatch results when the reconstructed reticle, also referred to as a perceived image, is displayed on an object either closer or further than the intended distance. This means that the reconstructed reticle will move around as the viewing eye moves. If the reconstructed reticle is displayed on an object at the predetermined distance from the hologram apparatus, then the image should not move. It is desired that the reconstructed reticle remains still as the viewing eye moves about a display hologram when the reconstructed reticle is displayed on objects at varying distances. This effect would improve shooting accuracy and precision. Accordingly, there is a need for a holographic weapon sight that corrects for parallax mismatch.

A dual H.O.E. assembly can present several challenges. For example, if the H.O.E. alignment in use does not match near perfectly with how the H.O.E. was recorded, then undesired imaging results. Accordingly, a need exists to provide weapon sights with improved holographic imaging in a compact and convenient setting.

SUMMARY OF THE INVENTION

The present disclosure is generally related to a sight assembly for mounting to a weapon. The sight assembly may have one or more of the features discussed herein. Some examples include an optical path with a carrier for the holographic optical element (H.O.E.) wherein the diode (specifically a wavelength stable light source in the present embodiment, however, other stabilities including mechanical, brightness . . . etc. could be utilized) is used as the virtual image reconstruction source (or real image). The optical path may utilize mirrors or lenses. The H.O.E., the diode and the mirror are in a fixed angular configuration with respect to one another, but may be adjusted either together or individually in a horizontal or vertical direction, or rotationally. The housing includes a transparent panel allowing light to transfer therethrough allowing the mirror, diode, and an H.O.E. to be in light communication with one another. Some examples include an adjusting mechanism with at least one screw having a shaft. Some examples include adjustment of only the diode (stable light source/VCSEL). Others include adjustment of the entire carrier, or of the holographic optical element. The shaft includes at least two portions wherein the two portions of the shaft of the screw have different pitch directions and/or pitch dimensions allowing for slight (or magnified) adjustment of the carrier to adjust the assembly. The assembly provides for a fixed angular arrangement of the carrier, mirror, diode and holographic optical element. Additional features are disclosed herein.

Another aspect of the present invention relates to a stable light source. The approach of the present invention is to use the VCSEL as a light source which is driven in such a way that its wavelength output will remain stable. The wavelength of the VCSEL is controlled by controlling the current it is given. This is done by adjusting the amplitude of the current drive signal. A detailed description of this is given below.

Further, the present disclosure is generally related to an assembly and method of correcting for parallax mismatch when viewing a reconstructed reticle through a weapon sight. The assembly may allow for virtual image distance adjustment. Accordingly, the virtual image plane can be adjusted. In an example, the adjustability can be made between a distance range of 25 meters to 500 meters. Using an adjusting lens and/or an adjusting light source can vary the virtual image plane so the viewer sees the reconstructed image at the target depth.

Yet another aspect of the present invention relates to a chassis for holding holographic elements. The present disclosure is generally related to a frame and/or chassis assembly for holographic weapon sights and method of making the same. A hologram frame assembly includes a hologram support operable for mounting a display hologram. A holographic optical element (H.O.E.) support is also provided that is operable for mounting a H.O.E. The H.O.E. support is spaced apart from the hologram support. A connector is provided for bridging the hologram support to the H.O.E. support. A reference beam support is included for mounting a reference beam source positioned to allow illumination of the H.O.E. The frame is constructed to align the display hologram and the H.O.E. in relative positions with respect to each other near identical to their respective relative positions at the time of their recording. In an example, the frame assembly is fabricated as a single integral unit.

A compact weapon sight includes a housing having a based configured to mount to a weapon, a holographic optical element (H.O.E.), the H.O.E. supported by the housing, a light source operable to emit a beam of light at an output wavelength when energized, the light source in communication with the H.O.E. a power source operable to energize the light source, a sensor for sensing a parameter of the light source and a control communicating with the sensor, the control operable to control a current from the power source to the light source, the control operable to adjust the current such that the output wavelength is approximately the same as a desired wavelength. In one embodiment, the sensor is a temperature sensor for sensing a temperature of the light source. The temperature sensor may be a voltage sensor operable to measure the voltage of the light source during an off-period of a duty cycle.

In another embodiment, the sensor is a wavelength sensor for sensing a wavelength of the light source. The sensor may be selected from of group of sensor systems including: a passive dispersion sensor system wherein a beam angle changes a fixed amount based on laser wavelength and the system includes one or more detectors for detecting beam angle changes, an interference filter system operable to output an optical signal that peaks at a center wavelength and the system includes a sensor for sensing the optical signal, an active dispersion sensor system wherein a beam angle changes by an adjustable amount based on laser wavelength and the system includes one or more detectors for detecting beam angle changes, an interferometric sensor system operable to produce wavelength dependent fringes in space or time and the system includes one or more detectors for sensing the wavelength dependent fringes, a polarization based sensor system operable to produce an output signal that peaks at a center wavelength or a semiconductor-based wave meter operable to analyze signal levels from two or more stacked detectors with different spectral responses. Further, the control may control the current in pulses such that the light source is energized for an on-period and is not energized for an off-period of a duty cycle. The light source may be a vertical-cavity surface emitting laser (VCSEL) diode. In one embodiment, H.O.E. is a first H.O.E., the sight further comprising a mirror, grating or second H.O.E., the light source illuminating the mirror, grating or second H.O.E. and being reflected or diffracted to illuminate the first H.O.E. The position of the mirror, grating or second H.O.E. may be adjustable. The beam of light may illuminate the H.O.E. Further, the the beam of light may be a non-collimated diverging beam of light.

The housing may include a chamber having a transparent portion, the light source being sealed within the chamber. The weapon sight may further include a carrier disposed in the chamber and a tie rod at least partially disposed in the chamber, the carrier connected to the tie rod so as to be pivotable about an axis of the tie rod wherein the light source is disposed on the carrier.

The weapon sight may further include a frame supporting the H.O.E. where the frame is disposed outside the chamber and connected to a portion of the tie rod extending outside the chamber and may further be structure to include the frame and the carrier both being rotationally fixed to the tie rod such that the light source and H.O.E. rotate together about the axis of the tie rod. The chamber may be filled with nitrogen in any of the embodiments.

The weapon sight may further include a carrier where the light source being disposed on the carrier, a frame supporting the H.O.E., and a tie rod supported by the housing for rotation about an axis of the tie rod, the carrier and the frame both being connected to and rotationally fixed to the tie rod so as to be pivotable about the axis of the tie rod such that the light source and H.O.E. rotate together relative to the housing about the axis of the tie rod.

Optionally, the weapon sight may include an elevation adjustment mechanism for adjusting the rotational position of the carrier and frame relative to the housing, the elevation adjustment mechanism comprising, a shaft supported by the housing and rotatable with respect to the housing, a first portion of the shaft having a first thread pitch, the first portion of the shaft threaded to a first member, the first member fixedly connected to the housing and a second portion of the shaft having a second thread pitch, the second portion threaded to a movable second member, the second member being rotationally fixed with respect to the housing and longitudinally movable with respect to the shaft, the second member connected to the carrier wherein the first thread pitch is different from the second thread pitch so as to provide for fine adjustment of the carrier as the shaft rotates.

The assembly may also include a windage adjustment mechanism operable to move the H.O.E. side to side with respect to the housing having a shaft supported by the housing and rotatable with respect to the housing, a first portion of the shaft having a first thread pitch, the first portion of the shaft threaded to a first member, the first member fixedly connected to the housing and a second portion of the shaft having a second thread pitch, the second portion threaded to a movable second member, the movable second member being rotationally fixed with respect to the housing and longitudinally movable with respect to the shaft, the second member connected to the H.O.E frame wherein the first thread pitch is different from the second thread pitch so as to provide for fine adjustment of the H.O.E. frame as the shaft rotates.

The weapon sight may further entail the beam of light from the light source may be a readout light beam having a readout light beam phasefront, the H.O.E. is a display hologram that reconstructs a reticle when illuminated by the readout light beam, the reconstructed reticle having a perceived distance and the sight further comprising an adjustable feature operable for adjusting the readout beam phasefront before illumination of the display hologram, wherein adjustment of the adjustable feature varies the perceived distance of the reticle image.

A movable lens may be positioned to modify the phasefront of the readout light beam prior to illuminating the display hologram. A holographic optical element (H.O.E.) may be disposed in a position to be illuminated by the light source, the H.O.E. reconstructing an angled readout light beam when illuminated by the light source, the angled readout light beam illuminating the display hologram.

The light source or the H.O.E. may be horizontally and/or vertically adjustable by means of a multi-thread pitch adjustment assembly. Further, the base of the housing may be integral with a weapon. The weapon sight may further include an accelerometer connected to the housing adapted to improve battery life of the sight assembly.

The present invention provided for a weapon sight having a light source operable for generating a readout light beam having a readout light beam phasefront, a display hologram spaced apart from the light source adapted to be illuminated by the readout light beam, the display hologram reconstructing a reticle when illuminated by the readout light beam, the reconstructed reticle having a perceived distance and an adjustable feature operable for adjusting the readout beam phasefront before illumination of the display hologram, wherein adjustment of the adjustable feature varies the perceived distance of the reticle image. The weapon sight may further include a power source operable to energize the light source, a sensor for sensing a parameter of the light source and a control communicating with the sensor, the control operable to control a current from the power source to the light source, the control operable to adjust the current such that the output wavelength is approximately the same as a desired wavelength. The sensor may be temperature sensor for sensing a temperature of the light source. The temperature sensor may be a voltage sensor operable to measure the voltage of the light source during an off-period of a duty cycle. The sensor may be a wavelength sensor for sensing a wavelength of the stable light source.

A movable lens may be positioned to modify the phasefront of the readout light beam prior to illuminating the display hologram. The adjustable feature may engage the movable lens and is operable to adjust the position of the movable lens with respect to the light source. The adjustable feature may be an adjustment mechanism operable to adjust a position of the light source with respect to the display hologram. The adjustable feature may be an adjustment mechanism having an adjustment screw.

The weapon sight may further include a holographic optical element (H.O.E.) disposed in a position to be illuminated by the light source, the H.O.E. reconstructing an angled readout light beam when illuminated by the light source, the angled readout light beam illuminating the display hologram. The H.O.E. and display hologram may be positioned in a relative image orientation selected from reflection/transmission, reflection/reflection, transmission/reflection, and transmission/transmission. The H.O.E. and the display hologram may be fixed on a hologram chassis formed to mount both elements in a fixed relationship to each other. A base with an attachment for mounting to an upper surface of a hand held weapon may also be provided.

The display hologram may be fabricated from a photopolymer. The light source may be a laser light source operable for generating a laser light beam. The laser light source may be a vertical-cavity surface emitting laser (VCSEL) diode. The adjustable feature may include a rotating adjustment that modifies the perceived distance incrementally from 25 meters to 500 meters. The adjustable feature may include a rotating adjustment that modifies the perceived distance continuously from 25 meters to 500 meters. The H.O.E. may extend at least partially outside of a housing. The housing may include a transparent portion and/or a filter providing for communication between the H.O.E. and the light source. The beam of light may illuminate the H.O.E., the beam of light being a non-collimated diverging beam of light.

A method of correcting for parallax and adjusting a perceived distance of a reconstructed image is provided including the steps of providing an assembly of the above and adjusting the adjustable feature to correspond to the distance of a target object.

A sight assembly for mounting to a weapon is provided including a housing, a chamber provided within the housing a light source disposed within the chamber of the housing, a holographic optical element (H.O.E.), the H.O.E. in communication with the light source and reconstructing a reticle viewable by a user when illuminated by the light source, the H.O.E. and the light sourced arranged in a fixed angular configuration, and an adjustment assembly adapted to adjust the holographic optical element and/or the light source, the adjustment assembly connected to the housing, the adjustment assembly adapted to finely adjust vertical or horizontal positioning of the holographic optical element and/or the light source relative to the housing. The chamber of the housing may be sealed. The assembly may further include a carrier and a tie rod, the carrier supporting the light source and connected to the tie rod, a portion of the tie rod being disposed outside of the chamber. The carrier may be pivotable about an axis of the tie rod. The chamber is filled with nitrogen. The adjustment assembly may be a multi-thread pitch adjustment assembly.

The H.O.E. may extends at least partially outside of the housing. The housing may include a transparent panel providing for communication between the H.O.E. and the light source. A mirror may be provided in communication with the H.O.E. and the light source. The mirror may be sealed within the chamber. A H.O.E. carrier may be provided to hold the H.O.E.

The sight assembly may further include a control for controlling the current to the light source and a temperature sensor for sensing a temperature of the light source, the temperature sensor providing an input to the control where the control being operable to adjust a current to the light source such that an output wavelength is approximately the same as a desired wavelength.

The assembly may further include a control for controlling the current to the light source and a wavelength sensor for sensing a wavelength of the light source, the wavelength sensor providing an input to the control where the control being operable to adjust the current to the light source such that an output wavelength is approximately the same as a desired wavelength.

An adjustment assembly for adjusting a component of a weapon sight includes a shaft mounted at least partially within a housing, the shaft rotatable with respect to the housing, a first portion of the shaft having a first thread pitch, the first portion of the shaft threaded to a first member, the first member fixedly connected to the housing, and a second portion of the shaft having a second thread pitch, the second portion threaded to a movable second member, the second member being rotationally fixed to the housing and longitudinally movable with respect to the shaft, the second member connected to an adjustable component of the weapon sight, the first thread pitch being different from the second thread pitch so as to provide for fine adjustment of the component of the weapon sight as the shaft rotates. The first member may be a nut fixed to the housing. The second member may be a nut. The component may be a carrier having a light source fixedly mounted thereto. The stable light source may be mounted within the housing. A holographic optical element (H.O.E.) is mounted at least partially outside of the housing. The housing may include a transparent portion providing for communication between a mirror, the light source and the holographic optical element.

A sight assembly for mounting to a weapon is provided including a housing having a chamber therein, a light source in communication with a holographic optical element, the light source and the H.O.E. positioned in a fixed angular arrangement, the light source and the holographic optical element in communication with each other to produce a reconstructed reticle viewable by a user and an adjustment assembly, the adjustment assembly adapted to adjust the vertical and/or horizontal position of the light source with respect to the housing without disrupting the fixed angular arrangement of the light source with respect to the H.O.E. The assembly may further include a control for controlling a current to the stable light source and a temperature sensor for sensing a temperature of the light source, the temperature sensor providing an input to the control wherein the control is operable to adjust the current to the light source such that the output wavelength is approximately the same as a desired wavelength. Further, the assembly may include a control for controlling a current to the light source and a wavelength sensor for sensing a wavelength of the light source, the wavelength sensor providing an input to the control wherein the control is operable to adjust the current to the light source such that the output wavelength is approximately the same as a desired wavelength. A housing may be provided having a chamber, the H.O.E. and the stable light source are mounted within the sealed chamber.

A carrier may be provided connected to a tie rod, portion of the tie rod positioned outside of the chamber, the carrier is pivotable about an axis of the tie rod. The chamber may be filled with nitrogen. The light source may be horizontally and/or vertically adjustable by means of an adjustment assembly. The adjustment assembly may be a multi-thread pitch adjustment assembly. The H.O.E. may extend at least partially outside of the housing. The housing may include a transparent portion providing for communication between the H.O.E., a mirror and the light source. A mirror may be provided in communication with the H.O.E. and the light source. A H.O.E. carrier may be provided to hold the H.O.E. The light source may be a VCSEL. An accelerometer may be provided connected to the housing adapted to improve batter life of the sight assembly.

A sight assembly for mounting to a weapon includes a housing having a chamber therein, a light source in communication with a H.O.E., the light source and the H.O.E. positioned in a fixed angular arrangement, the light source and the H.O.E. in communication with each other to produce a reconstructed reticle viewable by a user, a tie rod, the H.O.E. connected to the tie rod, and an adjustment assembly, the adjustment assembly adapted to adjust the vertical and/or horizontal position of the H.O.E. with respect to the housing without disrupting the fixed angular arrangement of the light source with respect to the holographic optical element. The assembly may further include a control for controlling a current to the light source and a temperature sensor for sensing a temperature of the light source, the temperature sensor providing an input to the control wherein the control is operable to adjust the current to the light source such that an output wavelength is approximately the same as a desired wavelength. Alternatively, the assembly further may include a control for controlling a current to the light source and a wavelength sensor for sensing a wavelength of the stable light source, the wavelength sensor providing an input to the control wherein the control is operable to adjust the current to the light source such that an output wavelength is approximately the same as a desired wavelength.

A housing may be provided having a chamber, the H.O.E. and the stable light source are mounted within the sealed chamber. The carrier may be pivotable about an axis of the tie rod. The chamber may be filled with nitrogen. The light source may be horizontally and/or vertically adjustable by means of an adjustment assembly. The adjustment assembly may be a multi-thread pitch adjustment assembly. The H.O.E. may extend at least partially outside of the housing. The housing may include a transparent portion providing for communication between the H.O.E., a mirror and the light source. A mirror may be provided in communication with the H.O.E. and the stable light source. A H.O.E. carrier may be provided to hold the H.O.E. The light source may be a VCSEL. An accelerometer may be provided connected to the housing adapted to improve batter life of the sight assembly.

A sight assembly for mounting to a weapon is provided including a housing having a chamber therein, a carrier, the carrier sealed within the housing, a mirror and/or a light source, the mirror and/or the light source mounted to the carrier, a H.O.E. mounted to the housing, the light source in communication with the H.O.E. to produce a reconstructed reticle, the light source and the H.O.E. being in a fixed angular arrangement, and an adjustment mechanism operable to adjust the vertical and/or horizontal position of the light source or the H.O.E. with respect to the housing without disrupting the fixed angular arrangement of the light source and the holographic optical element.

The assembly may further include a control for controlling a current to the light source and a temperature sensor for sensing a temperature of the light source, the temperature sensor providing an input to the control wherein the control is operable to adjust the current to the light source such that an output wavelength is approximately the same as a desired wavelength. Alternatively, the assembly may include a control for controlling a current to the light source and a wavelength sensor for sensing a wavelength of the stable light source, the wavelength sensor providing an input to the control wherein the control is operable to adjust the current to the light source such that an output wavelength is approximately the same as a desired wavelength.

A housing is provided having a chamber, the H.O.E. and the light source are mounted within the sealed chamber. The carrier may be pivotable about an axis of the tie rod. The chamber may be filled with nitrogen. The light source may be horizontally and/or vertically adjustable by means of an adjustment assembly. The adjustment assembly may be a multi-thread pitch adjustment assembly. The H.O.E. may extend at least partially outside of the housing. The housing may include a transparent portion providing for communication between the H.O.E., a mirror and the light source. A mirror may be provided in communication with the H.O.E. and the stable light source. A H.O.E. carrier may be provided to hold the H.O.E. The light source may be a VCSEL. An accelerometer may be provided connected to the housing adapted to improve batter life of the sight assembly.

An assembly for mounting to a weapon is provided having a H.O.E. and a stable light wherein the stable light illuminates the H.O.E. to reconstruct a holographic image viewable by a user. The H.O.E. and the stable light source may be mounted to a housing. The stable light source may be sealed within the housing. A mirror may be provided in communication with both the H.O.E. and the stable light source.

The stable light source and the mirror may be sealed within a housing. A transparent portion may be provided in the housing allowing the stable light source and the mirror to communicate with the holographic optical element. The H.O.E. may be adjustable. The stable light source may be adjustable. A lens may be provided between the mirror and the stable light source.

The assembly may further include a control for controlling a current to the light source and a temperature sensor for sensing a temperature of the light source, the temperature sensor providing an input to the control wherein the control is operable to adjust the current to the light source such that an output wavelength is approximately the same as a desired wavelength. Alternatively, the assembly may further include a control for controlling a current to the light source and a wavelength sensor for sensing a wavelength of the stable light source, the wavelength sensor providing an input to the control wherein the control is operable to adjust the current to the light source such that an output wavelength is approximately the same as a desired wavelength. The assembly may further include a carrier that is pivotable about an axis of tie rod. The housing may be sealed and filled with nitrogen.

A hologram frame assembly for use with a weapon sight includes a hologram support operable for mounting a display hologram, a H.O.E. support operable for mounting a H.O.E., the H.O.E. support spaced apart from the hologram support, a connector bridging the hologram support to the H.O.E. support, and a reference beam support for mounting a reference beam source positioned to allow illumination of the H.O.E. wherein the frame is constructed to align the display hologram and the H.O.E. in relative positions with respect to each other near identical to their respective relative positions at the time of their recording. The reference beam support may extend from the hologram support to allow for illuminating the H.O.E. in a reflective image generating arrangement.

The reference beam support, the hologram support, the H.O.E. support, and the connector may be formed as an integral construction. The display hologram and the H.O.E. may be in a parallel relationship with respect to each other. The hologram support defines a window sized and shaped to mount a display hologram. The H.O.E. support defines a window sized and shaped to mount a H.O.E. The reference beam support defines an opening for mounting the reference beam source. The display hologram and the H.O.E. each define a face having a surface area and wherein the surface area of the face of the H.O.E. is less than the surface area of the face of the display hologram. The reference beam source may be aligned with the H.O.E. and the H.O.E. is positioned in an angled relationship with respect to the display hologram. The may H.O.E. reconstructs an angled beam pattern forming a readout beam for illuminating the display hologram. The connector may extend in an angled configuration having a pair of spaced apart support walls extending from opposed edges of the hologram support to opposed edges of the H.O.E. support. A base connector may be provided for mounting to a hand gun or weapon.

A method of making a holographic weapon sight is provided including the steps of providing a hologram frame assembly having a hologram support, a H.O.E. support, a reference beam support, and a connector bridging the hologram support to the H.O.E. support, forming a display hologram mounted within the hologram support by illuminating a recordable medium with a readout beam and an object beam, recording a H.O.E. mounted within the H.O.E. support spaced apart from the hologram support by illuminating a recordable medium with a readout beam and a reference beam such that when recorded and illuminated by the reference beam, the readout beam is recreated and mounting a reference beam source within the reference beam support positioned to allow illumination of the H.O.E. wherein the frame is constructed to align the display hologram and the H.O.E. in relative positions with respect to each other near identical to their respective relative positions at the time of their recording.

BRIEF DESCRIPTION OF THE DRAWINGS

FIG. 3a illustrates an assembled perspective view of the holographic optical element, holographic optical element carrier, and the carrier all connected to the tie rod also having the windage adjustment screw attached thereto;

FIG. 4 illustrates an exploded perspective view of the holographic optical element, holographic optical element carrier and the carrier all connected to the tie rod also having the windage adjustment screw attached thereto;

DETAILED DESCRIPTION OF THE INVENTION

The present invention relates generally to a sight assembly for a weapon for reconstructing a virtual image used to assist in operation of the weapon. Particular examples will be described, including a variety of features. It should be understood that other examples may include one or more of these features in any combination.

The illustrated assembly incorporates a wavelength tunable light source (specifically a VCSEL). The assembly allows for slight adjustment of the fixed assembly and a sealed configuration to achieve an improved sight assembly.

Gun Sight Assembly and Adjustment

Figure 1A:
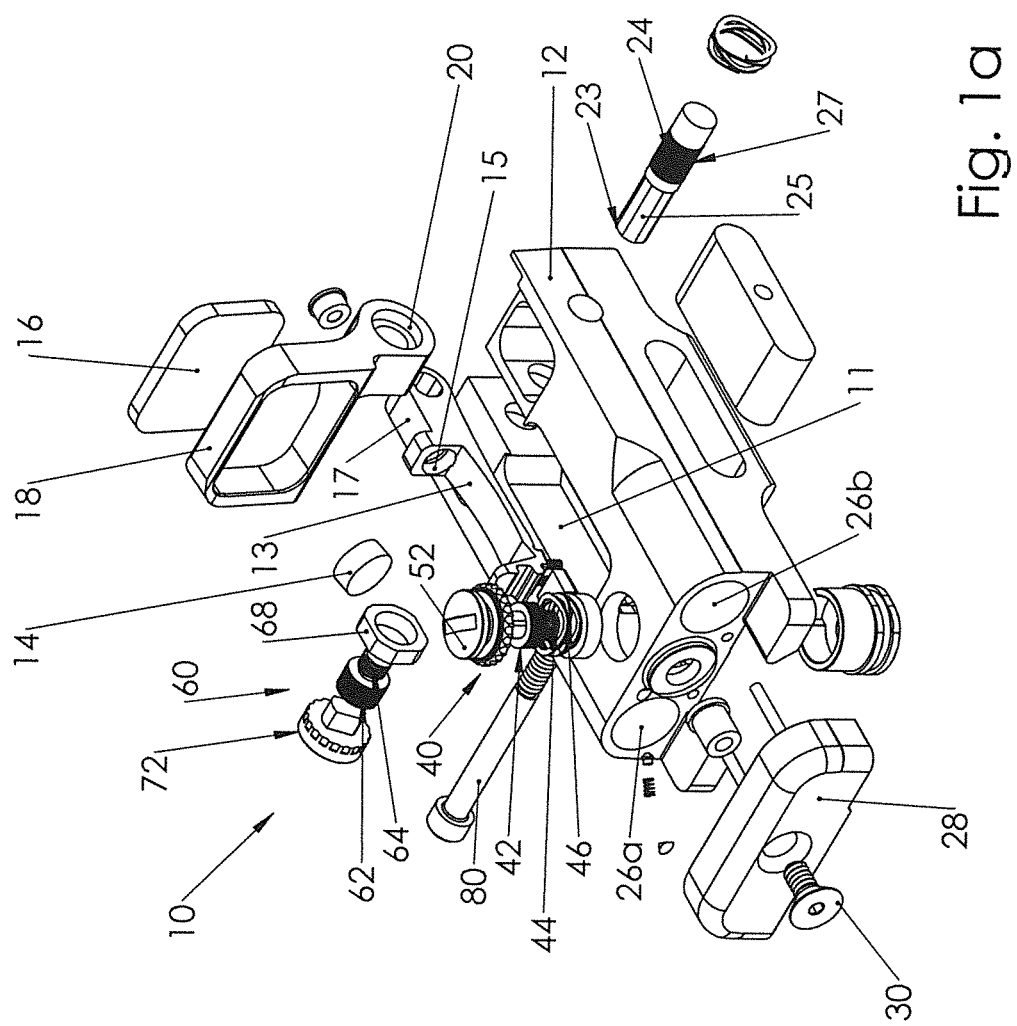
FIG. 1a discloses an exploded perspective view of the sight assembly.
Figure 1B:
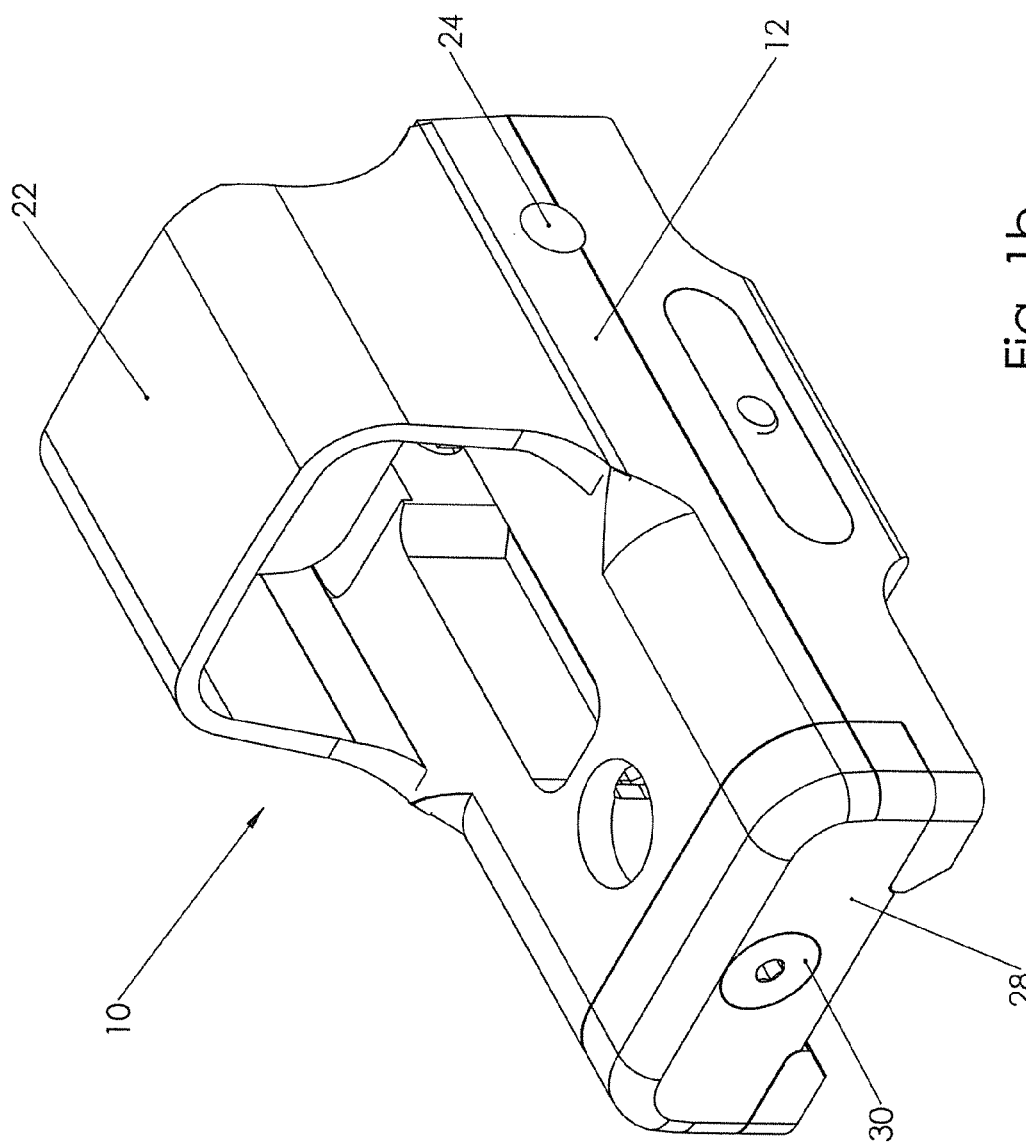
FIG. 1b illustrates an assembled perspective view of the sight assembly.

FIG. 1a illustrates an exemplary holographic gun sight assembly 10 having a housing 12. The housing 12 has an interior chamber 11 defined therein. As shown, the interior chamber 11 extends downwardly from an upper surface of the housing 12. A clear window, not shown, covers the opening in the upper surface. The elements contained within the chamber 11 in the housing are sealed therein to prevent dust or moisture from entering the housing. The chamber may also be filled with Nitrogen, thus requiring a secure seal.

The gun sight of the present invention is compact and intended for use with a hand held weapon. Compact being defined as occupying little space compared with others of its type. Accordingly, the gun sight of the present invention is significantly smaller and occupies less space as compared to similar gun sights. Furthermore, "hand held" is defined as being for use with a refile, handgun, pistol . . . etc. or any other known weapon commonly used in a hand held manner. "Hand held" way also include weapons mounted to a tripod (or other mount) but small in nature (small compared to a vehicle or airplane). Hand held includes all other non-vehicle (i.e. a tank) weapons.

A holographic subassembly is mounted to the housing such that portions of the subassembly are within the chamber 11 and portions are outside the chamber. The subassembly is shown at 8 in FIG. 2. The subassembly 8 includes an elongated carrier 13 that has a forward end 17 connected to a tie rod 24. The carrier 13 supports a laser diode 15 (or other stable light source), which is preferably a VCSEL, and a mirror 14. A H.O.E. carrier or frame 18 (or 22) supports a H.O.E. 16 generally perpendicular (or at a slight angle) to the carrier 13. The H.O.E. frame 18 includes an attachment portion 20 at its lower end. The attachment portion engages the tie rod 24 allowing the H.O.E. frame to connect at the same connection point as the carrier 13. The H.O.E. frame and the carrier are preferably both rotationally fixed to the tie rod such that the angular positions of the diode 15, mirror 14 and H.O.E. 16 are fixed. The diode 15 produces light that is reflected off of the mirror 14 into the H.O.E. 16. The H.O.E. refers to an element having a recorded image or effect thereon operable to manipulate a wave pattern or beam when illuminated. An H.O.E., for example, can recreate a readout beam in combination with beam expansion.

Unlike many prior art holographic image assemblies, the diode 15, mirror 14 and H.O.E. 16 are not part of an achromatic system of optical components.

Figure 2:
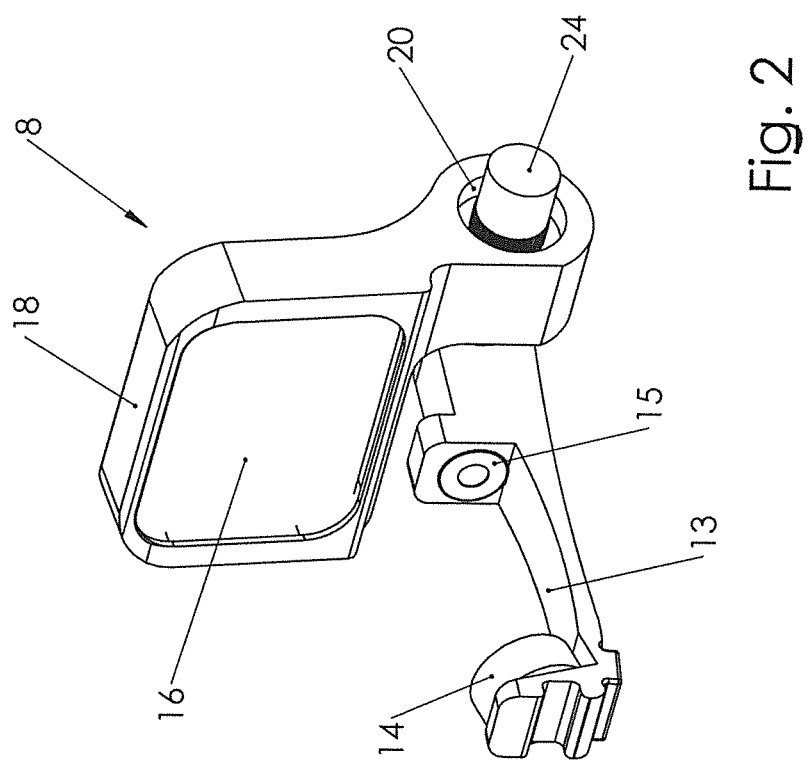
FIG. 2 illustrates a perspective view of the holographic optical element, holographic optical element carrier, and the carrier all connected to the tie rod.
Figure 7:
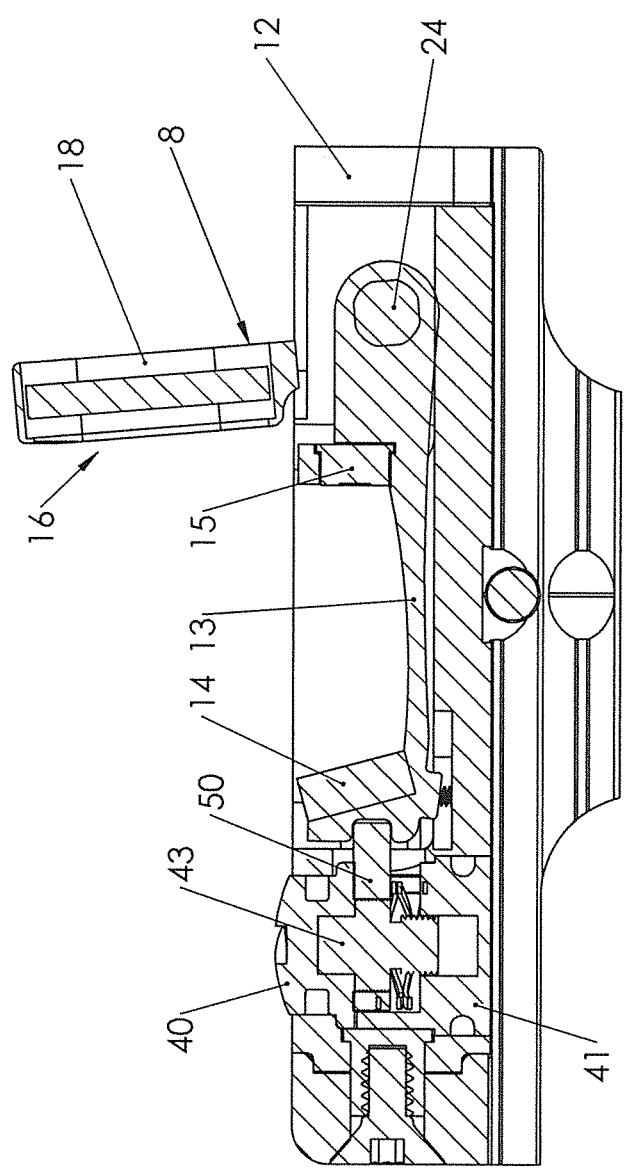
FIG. 7 illustrates a cross sectional view of the assembly of the sight.
Figure 8:
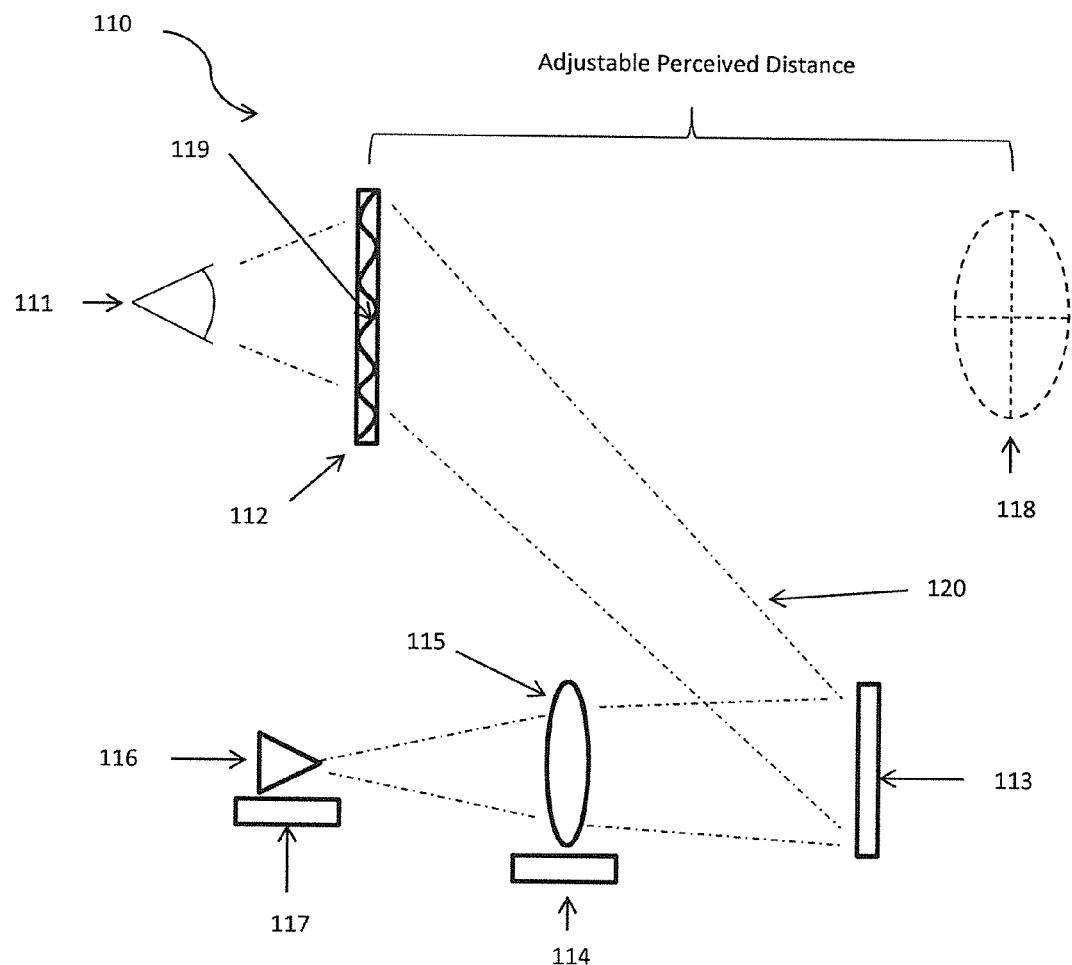
FIG. 8 illustrates an example hologram image assembly according to the present disclosure in a reflection/transmission configuration.
Figure 9:
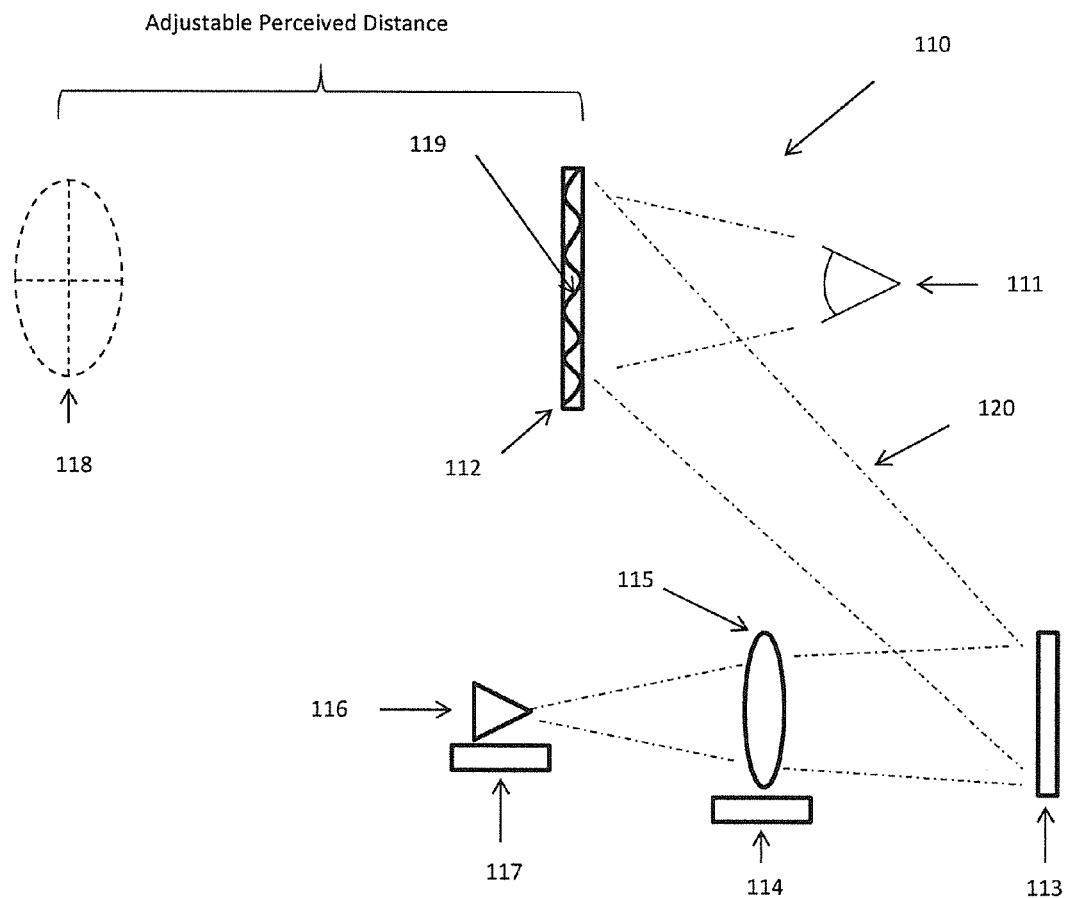
FIG. 9 illustrates an example hologram image assembly according to the present disclosure in a reflection/reflection configuration.
Figure 10:
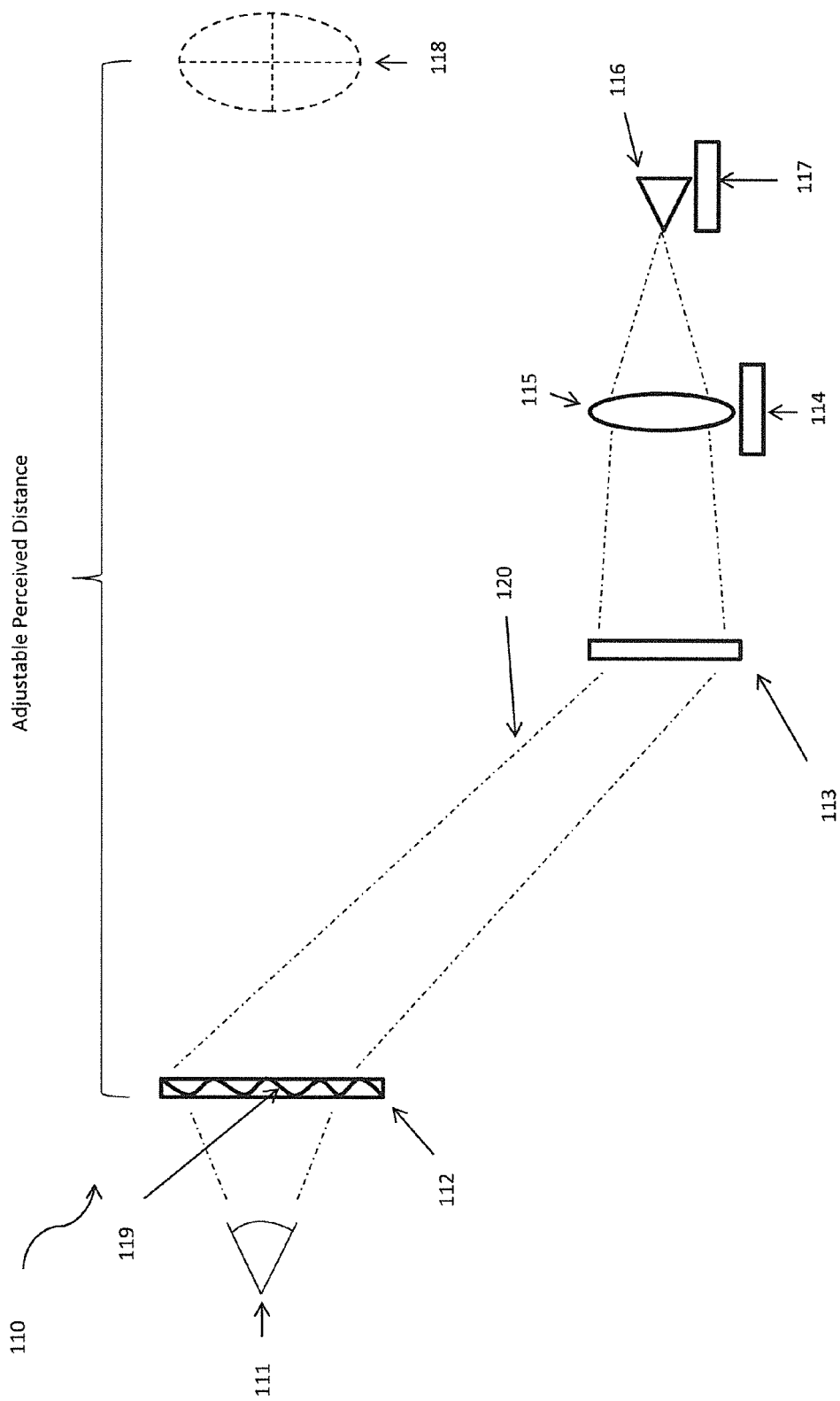
FIG. 10 illustrates an example hologram image assembly according to the present disclosure in a transmission/transmission configuration.
Figure 11:
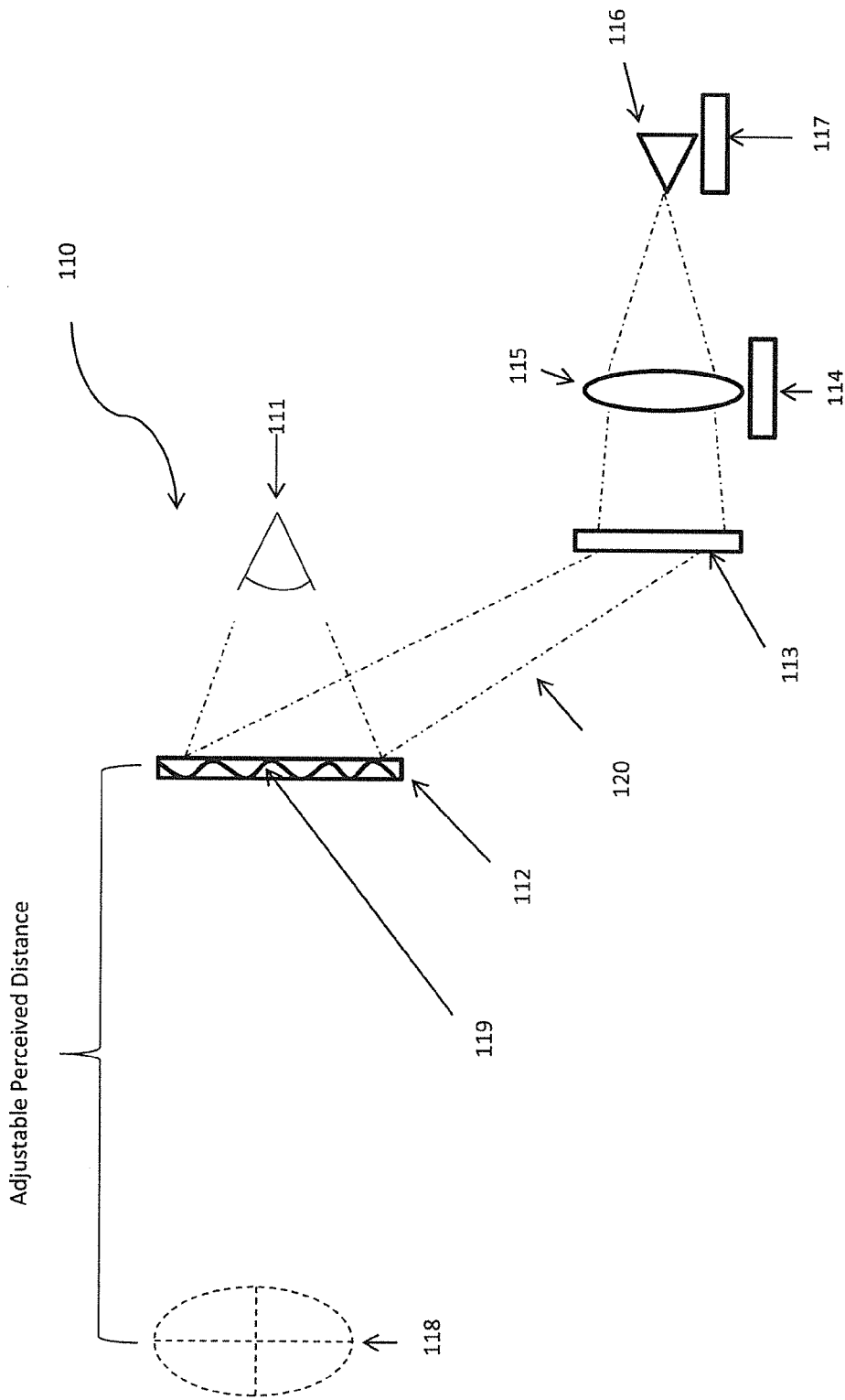
FIG. 11 illustrates an example hologram image assembly according to the present disclosure in a transmission/reflection configuration.

The components forming the subassembly 8 of FIG. 2 are also shown in FIG. 1a, in an exploded view. The cross-sectional side views of FIG. 7 help to illustrate the relationship between the subassembly 8 and the housing 12. The carrier 13, with the diode 15 and mirror 14, are disposed in the chamber 11. A transparent window 21 covers the chamber 11 such that the diode 15 and mirror are sealed into the chamber and protected from dust and humidity. A first portion 25 of the tie rod 24 engages the carrier 13 and is inside the chamber 11. However, a second portion 27 of the tie rod 24 extends through the housing 12 to a position outside this chamber 11. In the illustrated embodiment, the first portion 25 is a first end of the tie rod and has a non-circular shaped cross-section, as shown. The forward end 17 of the carrier 13 has a corresponding non-circular shaped cross-section for receiving the first end 23 of the tie rod 24. Because the first end 23 and the opening in the forward end 17 of the carrier have corresponding non-circular shapes, they are rotationally fixed to one another while also allowing the tie rod 24 to move along its axis with respect to the carrier 13. In the illustrated embodiment, the second portion 27 of the tie rod is fluted so as to tightly engage the opening in the attachment portion 20 of the H.O.E frame 18. The tie rod 24 and H.O.E. frame 18 are therefore rigidly attached to one another. The H.O.E. frame 18 and H.O.E. 16 are outside the chamber 11 but the tie rod rotationally ties the H.O.E. frame 18 and carrier 13 together such that their relative rotational positions remain the same despite part of the subassembly 8 being in the chamber and part being outside the chamber.

The tie rod 24 allows for a seal to be created to thus seal out any moisture or dust which can enter the housing and interfere with production of the hologram. The seal may be created by a tight fit between the tie rod and the housing and the tie rod and the carrier, by seals, or by flexible rubber or plastic, or like materials.

The housing 12 further includes apertures 26a, 26b where the batteries are stored for operation of the sight. The housing 12 further includes a cap 28 secured to the housing by means of a screw 30. The screw includes a head 72. The cap 28 encloses the batteries held within the apertures 26a, 26b. The cap 28 is removably attached allowing a user to replace the batteries.

Figure 6:
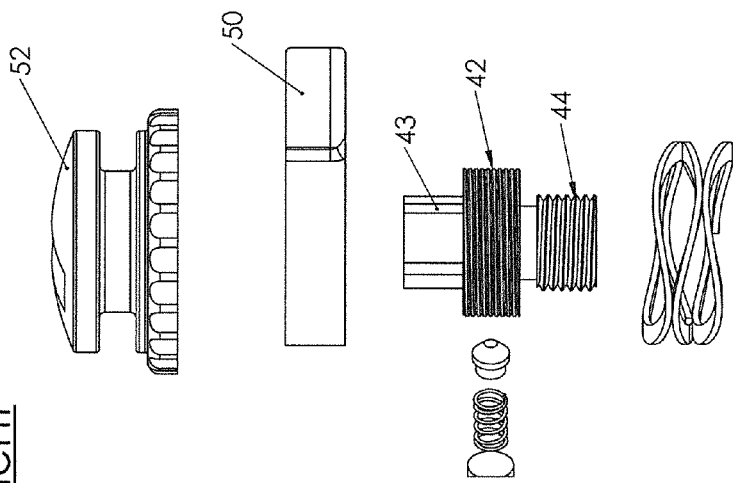
FIG. 6 illustrates an exploded side view of the elevation adjustment screw.
Figure 5:
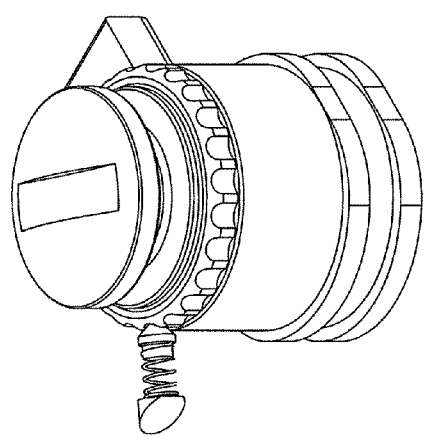
FIG. 5 illustrates an assembled perspective view of the elevation adjustment screw.

The position of the carrier 13 and H.O.E. frame 18 are adjusted by means of windage and elevation adjustors, which may use a multi-pitch screw. In a preferred embodiment, the screw or bolt of each adjustor includes two portions wherein each portion has a different thread pitch and/or different thread direction thus allowing for very fine adjustment. Two nuts are provided where one is fixed and the other is movable. The configuration of the dual nut assembly and relationship to the carrier is clearly illustrated in FIG. 7. FIG. 1a shows the same components in an exploded view. FIG. 5 shows an assembled elevation adjustment assembly and FIG. 6 shows an exploded view. A first nut 41 is fixed to the housing. A shaft 43 rotates relative to the fixed first nut 41, thereby moving up and down (or sideways if adjusting windage). Because of the varied threads on either the second nut 58 or on the shaft 43, when the shaft is rotated, the nut moves faster (or slower) as compared to the shaft because of the varied thread, A second nut engages the carrier 13 and is prevented from rotating relative to the housing and carrier. Therefore, the shaft 43 rotates relative to both the fixed nut 41 and the second nut. If the two nuts were to have the same direction and pitch of threads, the spacing between the nuts would remain constant. By changing the pitch or the thread of the two nuts, the spacing between the nuts will change as the shaft rotates.

The adjustment provides a fixed elevation adjustment wherein it moves the subassembly 8, by rotating the subassembly about the pivot axis defined by the tie rod. Therefore, the diode, the H.O.E., and the mirror move relative to the housing 12. The elevation adjustment assembly 40 includes the shaft 43 having a first portion 42 and a second portion 44. The shaft is connected to a threaded hole 46 (or nut) which is connected to the housing 12. The nut 46 (or housing portion) is fixed. The movable threaded nut 50 is provided with a pitch different than the nut connected to the housing. These two nuts may have a right-hand thread or a left-hand thread, but preferably each have the same direction of pitch. Alternatively, they may have opposite pitch, but this magnifies the adjustment. Preferably the first portion 42 has a coarser pitch than the second portion, as shown in FIG. 6. This allows for very fine adjustment of the carrier position. A floating bolt head 52 engages the top of the shaft 43, allowing the user to rotate the shaft and thus adjust the elevation of the carrier. Adjustment may be made by a screwdriver, lever, handle, etc. allowing the user to rotate the shaft/bolt.

This same fine adjustment movement is also illustrated in the windage adjustment assembly 60, as shown in FIGS. 1a, 3a-3c and 4. The windage adjustment assembly 60 includes a shaft having a first portion 62 and a second portion 64. A first and second nut are both provided wherein a first nut is connected to, or forms part of, the housing and a second nut 68 is provided which moves side to side. The moving nut includes an end portion which abuts and engages the carrier 13 and when the shaft is rotated moves the carrier to adjust the windage. As discussed above, the tie rod 24 may move linearly in the opening in the carrier 13. As the windage adjustment presses on the tie rod, the tie rod 24 and frame 18, which is fixed to the carrier 13, moves side to side. Spring preloads the tie rod against the windage adjustment. Nut 68 is the stationary nut, captured in the housing 12. The tie rod 24 would serve as the moveable (sliding) nut. This allows the frame 18 and tie rod 24 to slide is unison while the profile of the first portion 25 of the tie rod and 17 of the carrier keep the frame 18 in a fixed angular position.

Figure 3B:
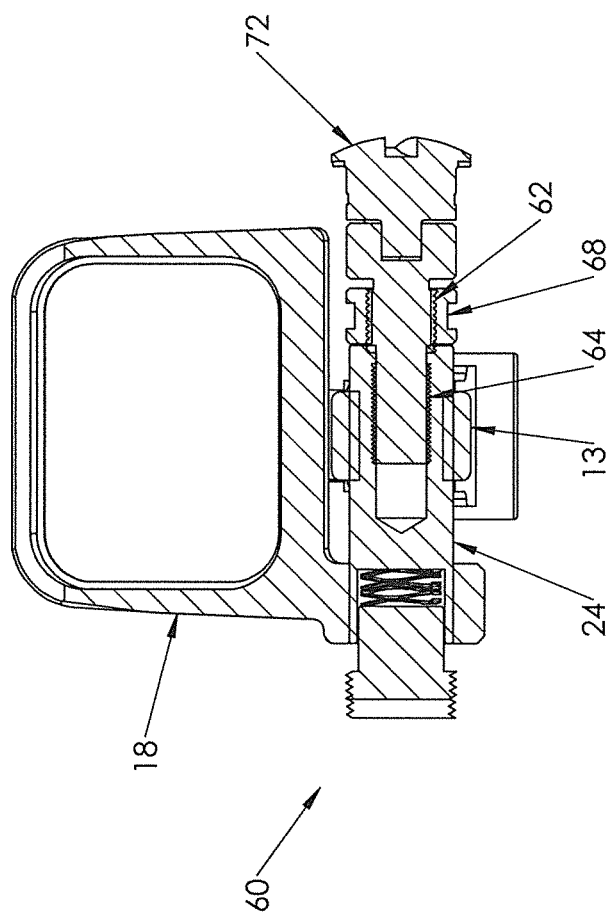
FIG. 3b illustrates a cross-sectional view of the adjustment screw assembly.
Figure 3C:
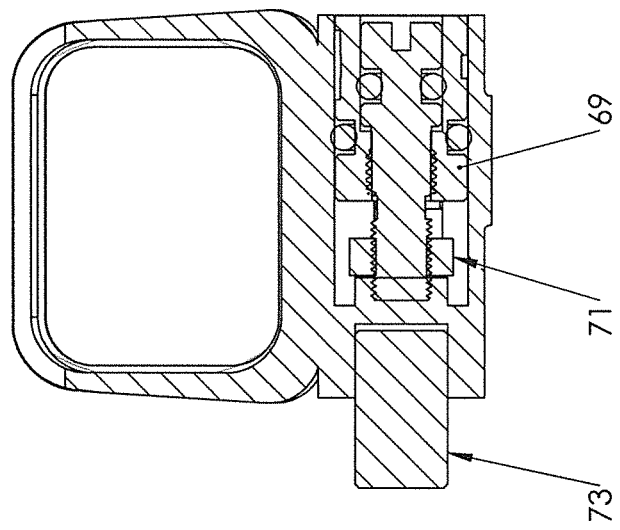
FIG. 3c illustrates a cross-sectional view of an alternative embodiment of the screw assembly operable to move the light source.

FIG. 3c illustrates a cross-sectional view of an alternative embodiment of the screw assembly operable to move the light source including a stationary nut 69, a movable nut 71 and a support pin 73. Nut 69 is the stationary nut, captured in the housing. This allows the frame (or carrier) to slide is unison keeping the H.O.E., light source and mirror in a fixed angular position.

This fine movement of the adjustment screws discussed above allows for movement of the perceived image in a very minimal way. Due to the nature of the hologram little if any distortion is perceived from this movement. Set screws with nylon tips could eliminate any movement due to tolerance.

Various configurations of the H.O.E., mirror, light source, lens and corresponding adjustment mechanisms can be utilized. By way of example, FIGS. 14-18 illustrate just a few of the arrangements of the H.O.E., mirror, light source, lens and corresponding adjustment mechanisms. Any of the following arrangements described below and illustrated in FIGS. 14-18 may be utilized in the housing and with the adjustment mechanisms described in this specification. Further, any of the following arrangements described below and illustrated in FIGS. 14-18 may be sealed within a housing or utilize the parallax mismatch or VCSEL technology discussed below.

Figure 14:
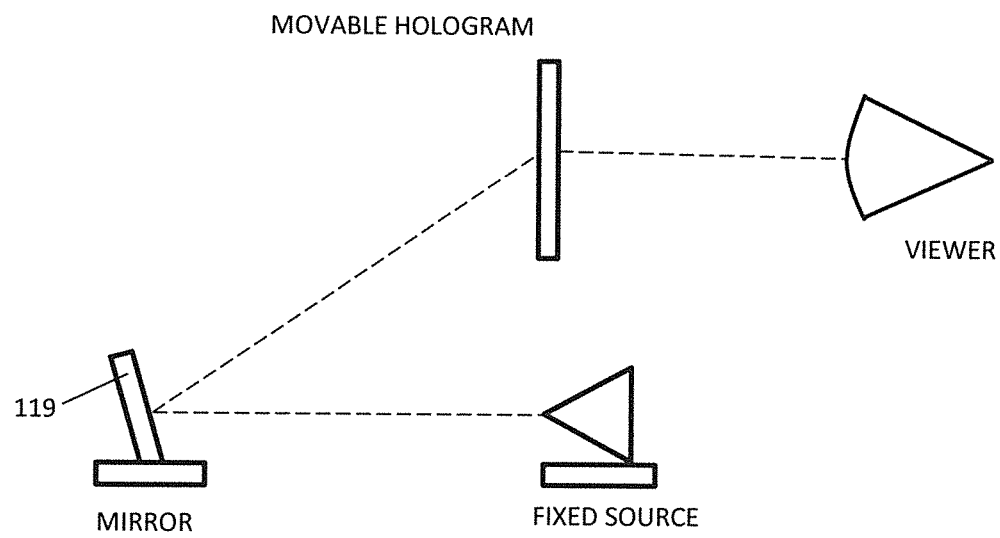
FIG. 14 illustrates a schematic configuration of the H.O.E., mirror and stable light source.

Now referring to FIG. 14, a fixed light source 116 is in direct communication with a mirror 119. The mirror is accordingly in direct communication with the movable image or H.O.E. 113. In one embodiment, the mirror 119 and the light source 116 are sealed within a housing. The H.O.E. 113 may be provided outside of the housing and able to communicate with the mirror through a transparent panel in the housing. The viewer 111 is then able to view the image on the H.O.E. 113. The H.O.E. 113 may be movable side to side, up and down and/or may pivot or rotate about a horizontal or vertical axis to achieve windage and elevation adjustment and/or fine tuning the position of the perceived image. This movement may be achieved with any type of adjusting mechanism. In this embodiment, the position of the source 116 and mirror are both fixed.

Figure 15:
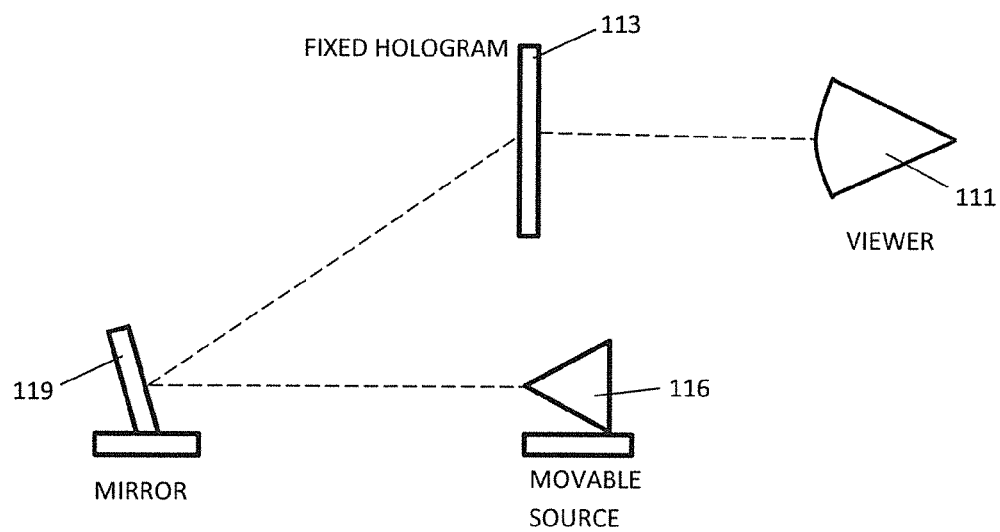
FIG. 15 illustrates a schematic configuration of the H.O.E., mirror and movable stable light source.

Now referring to FIG. 15, a movable light source 116 is in direct communication with a mirror 119. The mirror is accordingly in direct communication with the image or H.O.E. 113. The H.O.E. 113 is fixed in this configuration. In one embodiment, the mirror 119 and the movable light source 116 are sealed within a housing. The H.O.E. 113 may be provided outside of the housing and able to communicate with the mirror through a transparent panel in the housing. The viewer 111 is then able to view the image on the H.O.E. 113. The movable light source 116 is movable by means or a track, an adjustment screw (such as discussed above) or any other suitable means for recreating movement. The source 116 may be movable side to side, up and down and/or may pivot or rotate about a horizontal or vertical axis to adjust aspects of the perceived image.

Figure 16:
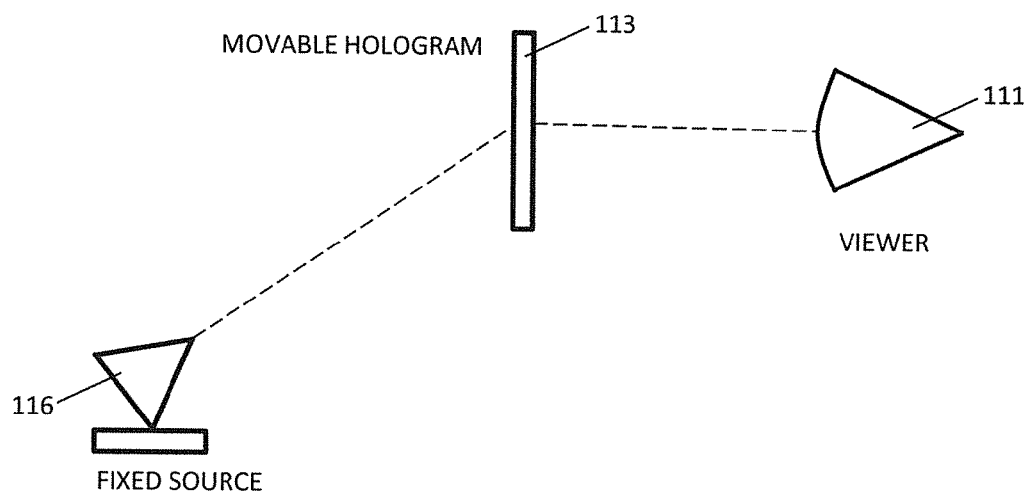
FIG. 16 illustrates a schematic configuration of the H.O.E. and fixed stable light source.

Now referring to FIG. 16, a simplified arrangement is disclosed, eliminating the need for a mirror. FIG. 16 illustrates a fixed light source 116 in direct communication with a movable image or H.O.E. 113. The H.O.E. 113 is movable in this configuration. In one embodiment, the light source 116 is sealed within a housing. The H.O.E. 113 may be provided outside of the housing and able to communicate with the mirror through a transparent panel in the housing.

In other embodiments, the H.O.E. 113 and the light source 116 are all sealed within the housing. The viewer 111 is then able to view the image on the H.O.E. 113. The movable H.O.E. 113 is movable by means or a track, an adjustment screw (such as discussed above) or any other suitable means for recreating movement. The H.O.E. 113 may be movable side to side, up and down and/or may pivot or rotate about a horizontal or vertical axis to achieve windage and elevation adjustment and/or fine tuning the position of the perceived image.

Figure 17:
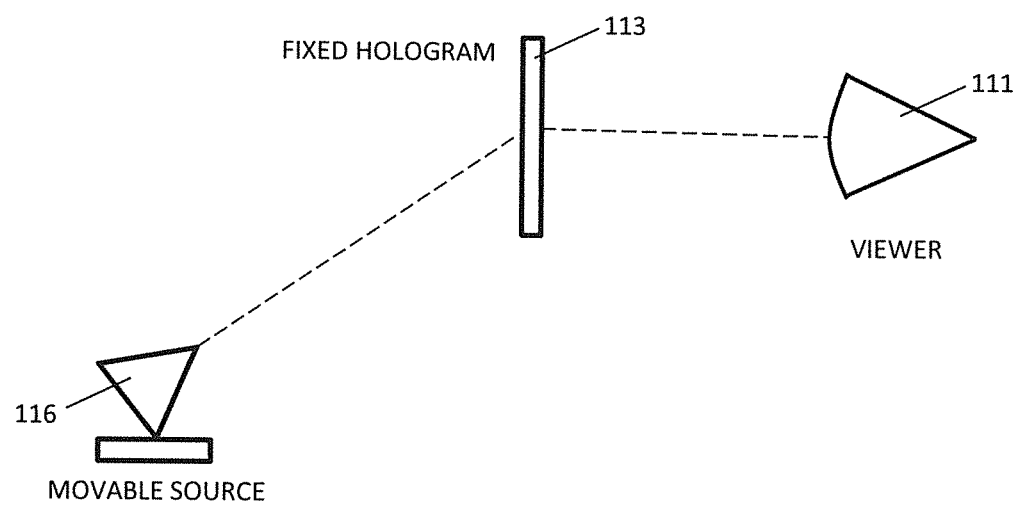
FIG. 17 illustrates a schematic configuration of the H.O.E. and movable stable light source.

Now referring to FIG. 17, another simplified arrangement is illustrated, also eliminating the need for a mirror. FIG. 17 illustrates a movable light source 116 in direct communication with a fixed image or H.O.E. 113. Light source 116 is movable in this configuration. In one embodiment, the movable light source 116 is sealed within a housing. The H.O.E. 113 may be provided outside of the housing and able to communicate with the mirror through a transparent panel in the housing. In other embodiments, the H.O.E. 113 and the light source 116 are all sealed within the housing. The viewer 111 is then able to view the image on the H.O.E. 113. The movable light source 116 is movable by means or a track, an adjustment screw (such as discussed above) or any other suitable means for recreating movement. The source 116 may be movable side to side, up and down and/or may pivot or rotate about a horizontal or vertical axis to adjust aspects of the perceived image.

Figure 18:
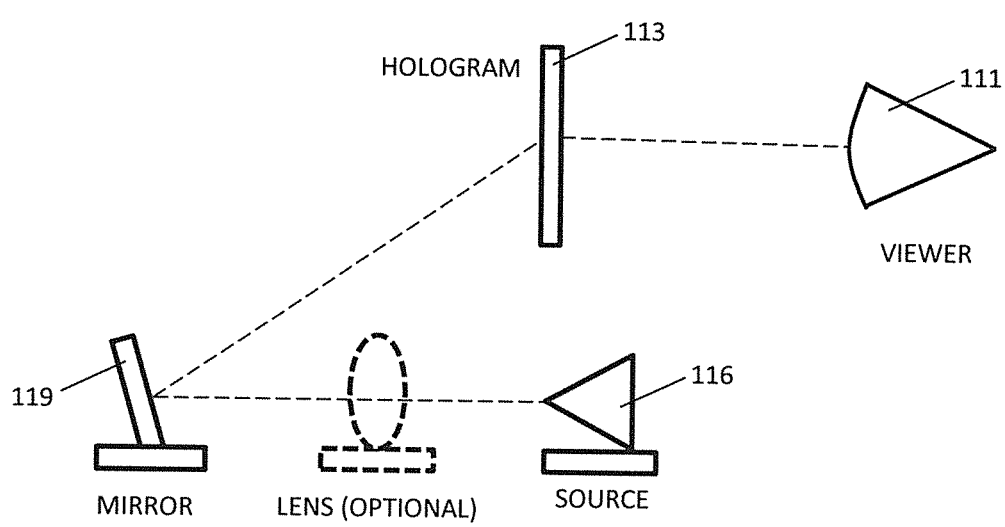
FIG. 18 illustrates a schematic configuration of the H.O.E., mirror and stable light source having an optional lens between the stable light source and the mirror.

Now referring to FIG. 18, an optional version arrangement is shown, including an optional lens 115. The lens 115 can be used to change the phasefront or wavefront of the emitting light before illuminating the H.O.E. 113 or the mirror 114. The light source 116 is provided in communication with the mirror 114 through the optional lens 115. Either the mirror 119 or the light source 116 may either be fixed or movable. The mirror 119 is then in communication with the H.O.E. 113. In one embodiment, the mirror 114, the lens 115 and the light source 116 are all sealed within the housing. The H.O.E. 113 may also be sealed within the housing. The viewer 111 is then able to view the image on the H.O.E. 113.

Additional embodiments may include any combination of the arrangements in FIGS. 14-18. For example, both the light source and H.O.E may be moveable and a lens may be provided. The lens may also be repositioned, such as being between the mirror and image, or more than one lens may be used. The mirror in any embodiment may be replaced with an H.O.E. that recreates a beam for illuminating the image H.O.E.

Parallax Mismatch

Referring now to FIGS. 8-12, the present disclosure may incorporate an assembly 110 for holding one or more H.O.E.s and for use with a weapon sight. The various assemblies disclosed in FIGS. 8-12 may be used with the assembly as discussed above and in the attached claims. The assembly 110 allows for adjustment of a perceived distance of a reconstructed reticle 118. A reconstructed reticle is defined as a virtual image created by the H.O.E.

The assembly 110 includes a display hologram 112, also referred to as a hologram 112. The configurations as illustrated in FIGS. 8-12 may be incorporated within the housing of the present invention (or at least partially sealed within the housing). FIGS. 8, 9, 10 and 11 demonstrate paths configured to utilize two H.O.E. components. This configuration and technique may provide reduced wavelength effects. The first H.O.E. shapes the beam (not possible with grating) hence creating an optical configuration not previous geometrically possible with grating and an H.O.E.

Display hologram 112 includes a holographic wavefront of a reticle 119 (also referred to as wavefront 119) recorded thereon using any known recording technique. Wavefront 119 onto hologram 112 can include emitting a reference beam and an object beam in the presence of a reconstructed reticle or image mask thereby recording the image onto the display hologram. In one example, hologram 112 can be fabricated from a film material requiring chemical development. In this example, hologram 112 is fabricated from a photopolymer which eliminates the need for costly and hazardous chemical processing.

Wavefront 119 recorded on hologram 112 allows for a reconstructed reticle 118 to be displayed at a perceived distance from the assembly 110. The image is viewed by a user represented schematically as viewing eye 111. Displaying a perceived image 118 occurs when hologram 112 is illuminated by a readout beam corresponding to or matching the light beam used during recording. In one example, the hologram is illuminated directly from a reference light beam source. In this example, the readout light beam is an angled light beam 120 from an H.O.E. 113. Angled light beam 120 is a readout beam in these examples. In another example, a grating can be used H.O.E. 113 can also be fabricated from a photopolymer. In this example, diffracted light from H.O.E. 113 (light beam 120) illuminates the H.O.E. 112. Accordingly, light source 116, when activated, emits a light beam that illuminates H.O.E. 113. In an example, light source 116 can be a laser light source operable for emitting a laser light beam. In a further example, the laser light source is a vertical-cavity surface-emitting laser ("VSCEL"). Any other narrow spectrum source may also be utilized.

Figure 12:
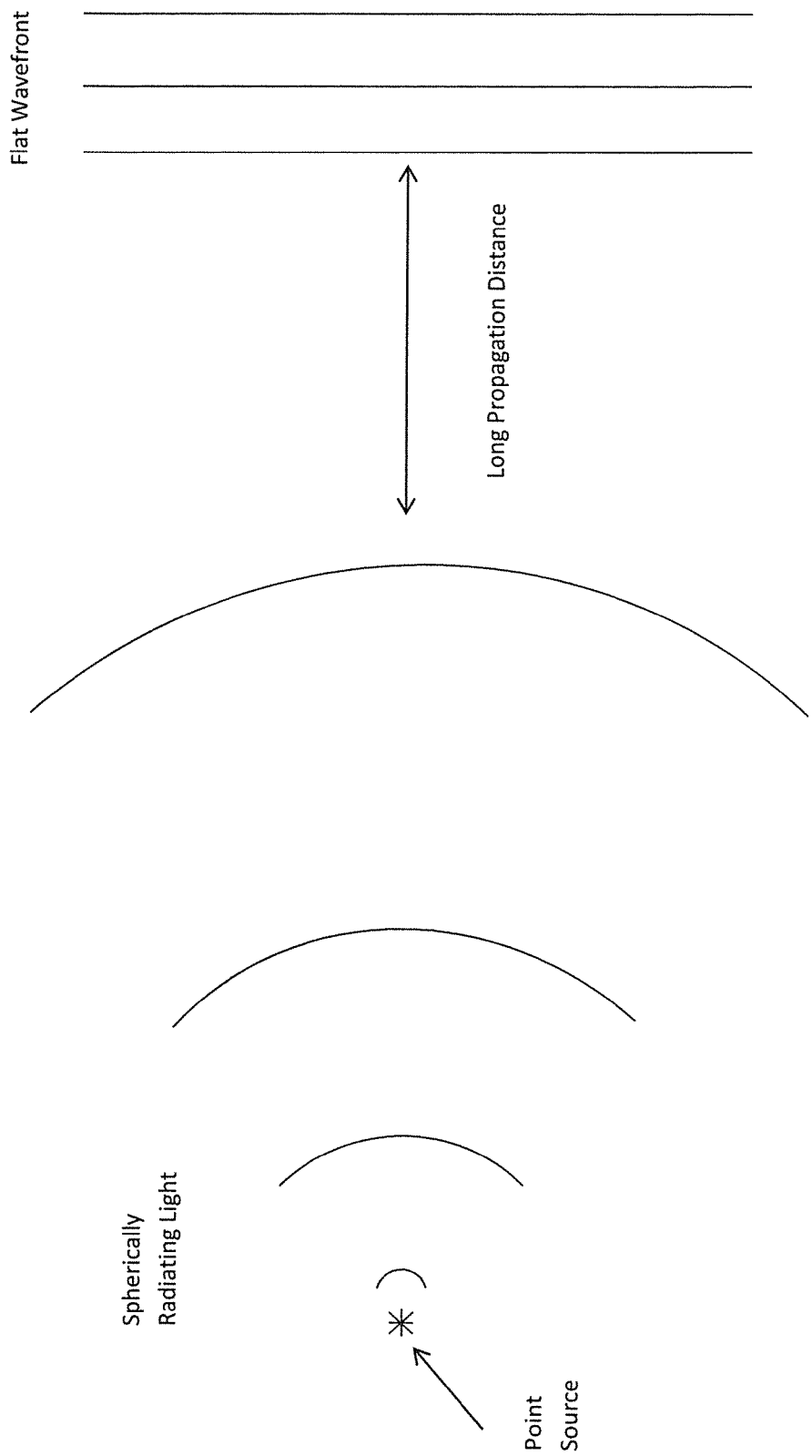
FIG. 12 illustrates an example of wavefront/phasefront propagation.

A lens 115 can be provided between the light source 116 and the H.O.E. 113. Lens 115 can be used to change the phasefront or wavefront of the light before illuminating. FIG. 12 illustrates how the wavefront of light waves propagate (and become flatter with distance) as they move away from the source. Adjustment of the phasefront corrects for parallax mismatch of the perceived image 118 by adjusting the perceived distance of the perceived image. The phasefront can be adjusted by adjusting either the lens 115 position or the light source 116 position, relative to the H.O.E. 113. In this example, the lens 115 can be adjusted along a lens adjustment track 114. Lens adjustment track 114 can be adjusted manually by hand either continuously or incrementally corresponding to varying perceived distances. Likewise, light source 116 can be adjusted via a light source adjustment track 117. In an example, more than one lens is used and it is conceivable that lens assemblies having a plurality of lenses are used. It is further possible that these lenses can be individually or collectively adjusted to generate various magnifications. In yet a further example, adjustment of the position of the H.O.E. and/or the display hologram can also impact the perceived distance of the reconstructed reticle.

The present disclosure further provides for a base with an attachment for mounting to an upper surface or rail of a weapon. The base could also be the weapon itself. The assembly is also operable to mount directly to the weapon without the need of a separate base. The adjustable feature can include a rotating adjustment that modifies the reconstructed reticle perceived distance incrementally from 25 meters to 500 meters. In a further example, the adjustment occurs incrementally by a factor of 25 meters. In an alternative embodiment, the adjustable feature includes a rotating adjustment that modifies the target image perceived distance continuously from 25 meters to 500. The adjustable feature corrects for parallax by adjusting the reconstructed reticle distance to align with the actual distance of a reconstructed reticle. The perceived image is displayed on the target image and if positioned at the right distance, the image will not move with slight movements of the viewing eye (i.e. no parallax).

VCSEL

A gun sight in accordance with the present invention may also incorporate the thermal control referred to herein as smart light control. Thermal stability of the-virtual image, or the observed position of the reconstructed reticle, is achieved by using a wavelength tunable source which may be a VCSEL. The need for stability is a consequence of the changes in ambient temperature. A VCSEL as a light source is used which is driven in such a way that its wavelength output will remain stable. The wavelength of the VCSEL is controlled by controlling the current it is given. The smart light control varies the amplitude of the laser current to correct for wavelength drift caused by temperature changes. Alternatively, the control system may be used to adjust the wavelength to a desired wavelength.

In some examples, a pulse width signal is used to energize the VCSEL. As such, the VCSEL is energized and on for an on-period and turns off for an off-period. This on/off cycling is very rapid such that the laser light produced by the VCSEL may appear as substantially constant to a human observer. Brightness is adjusted by varying the duty cycle. The duty cycle can be changed by (1) modulating the pulse width and/or (2) varying the pulse repition frequency (PRF).

In some versions, an open loop control system is used to control the VCSEL. In this example, the temperature of the VCSEL is monitored and then the current to the VCSEL is adjusted to a value based on the known or tested characteristics of the VCSEL. In some examples, the temperature of the VCSEL is determined by measuring the temperature using a thermocouple or other temperature sensing element in close proximity to the VCSEL. Any approach to temperature sensing may be used. In another approach, the VCSEL is "interrogated" with a low level bias current during the off-period of the duty cycle. As known to those of skill in the art, the voltage of the VCSEL will change with temperature. This allows the temperature of the VCSEL to be directly determined. This information is then used by the control system to adjust the current input during the subsequent on-periods of the cycle. Alternatively, the control may be a temperature control from another area, such as near the VCSEL.

In an alternative approach, a closed loop control system is used wherein a wavelength sensor measures the output wavelength of the VCSEL. This information may then be used by the control system to adjust the current to the VCSEL, allowing a desired output wavelength to be achieved. Example sensor systems are:

a) Passive dispersion (e.g. grating or prism) changes the beam angle a fixed amount based on laser wavelength with the sensor being one or more detectors b) Interference filter (e.g Bragg notch filter, Fabry-Perot) outputs an optical signal that peaks at a center wavelength and is sensed by one detector.

c) Active dispersion (e.g. AOM and AOTF) changes the beam angle an adjustable amount based on laser wavelength with the sensor being one or more detectors d) Interferometric (e.g. FTIR and Sagnac) produces wavelength dependent fringes in space or time and is sensed by one or more detectors.

e) Polarization (e.g. polarizer and analyzer) produces an output signal that peaks at a center wavelength.

f) Semiconductor-base wave meters analyze signal levels from two or more stacked detectors with different spectral responses.

Case (a) can also be implemented by integrating the wavelength grating into the hologram. For example, when the hologram was constructed a second object beam would be introduced, that when readout would illuminate the one or more detectors.

Cases (a) and (b) when a single detector is used, the controller will need to dither the laser wavelength to maintain the maximum signal. The dithering will also shift the reticle and must be limited to a narrow range; this effect can be avoided at the cost of two or more sensors. For cases (a) and (b) two or more sensors will produce two signals that can be adjusted to some desired levels and avoids dithering.

Case (c) uses dithering that is applied to a piezoelectric and produces a beam steering similar to case (a). This dither, however, doesn't affect the reticle position and can be sensed by any detector configuration.

Cases (d), (e), (f) would be operated in the conventional wavelength sensing modes.

The control system may use one or multiple inputs, such as information from a wavelength sensor, a temperature sensor, or other information.

In accordance with a further aspect of the present invention, a holographic sight is constructed including a VCSEL and a current control system as described above. Alternatively, any other wavelength stable light source may be used. Such a sight may reduce or eliminate the need for an achromatic system and may achieve higher levels of wavelength stability over an operating temperature range. In one example, the wavelength output of a VCSEL may change by approximately 2 nanometers over a 40° Celsius temperature range. The same VCSEL may have a current sensitivity such that a change in current will cause a 2 nanometer change in the wavelength, thereby allowing complete compensation for wavelength shift. Such a holographic sight may include an open loop or a closed loop control system as described above. In a further example, the control system may be used to adjust the position of a holographic image in the sight. For example, changes in wavelength may cause a change in the perceived vertical position of the holographic image in the sight. As such, the wavelength may be adjusted so as to compensate for elevation. For example, the current level may be changed so as to raise or lower the perceived position of the holographic image, depending on the design of the sight. As such, the present invention allows electronic adjustment of elevation in certain embodiments.

Figure 13:
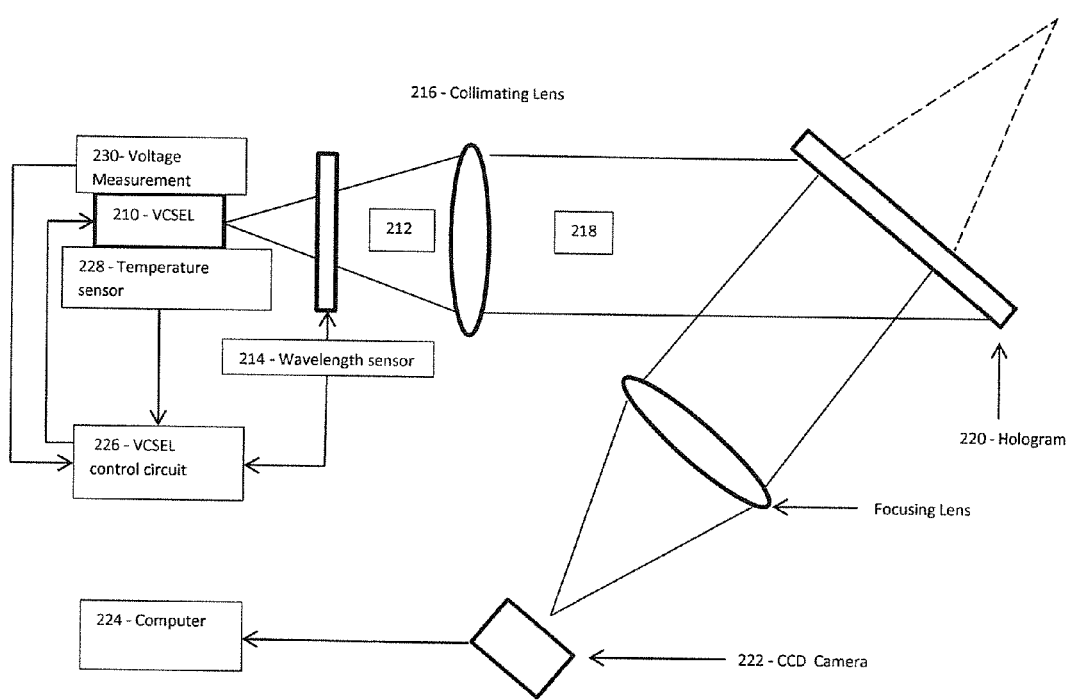
FIG. 13 illustrates an exemplary holographic testing system.

Referring now to FIG. 13, an exemplary holographic testing system is illustrated, utilizing a VCSEL with current control of wavelength in accordance with certain embodiments of the present invention. The system includes a VCSEL 210 that emits a spreading beam of light 212. A wavelength sensor 214 may be disposed at least partially in this beam, for use as part of a closed loop control system. In the illustrated embodiment, a collimating lens 216 collimates the light 212 into a collimated beam 218, and this beam 218 illuminates the hologram 220. In this testing system, a camera 222 is focused on the reconstructed image so as to monitor the position of the reconstructed image. The camera image is then viewable on a computer 224. A VCSEL current control circuit 226 controls the current, duty cycle, and other factors of the signal provided to the VCSEL 210. The control circuit 26 may receive input from a wavelength sensor 214 and a temperature sensor 228, which is located in close proximity to the VCSEL. Alternatively or additionally, the voltage of the VCSEL may be measured during the off-period of the duty cycle and used to determine the temperature of the VCSEL. A voltage measurement element is shown at 230. As will be clear to those of skill in the art, the illustrated system allows the wavelength output of the VCSEL to be controlled so as to achieve a stable wavelength across a temperature operating range and/or to allow adjustment of the perceived image.

A VCSEL with a current control system as described above may also be used with a variety of other laser devices. For example, certain types of imaging systems utilize a laser light source and it may be useful to adjust or control the output wavelength of the laser light source. Such applications form other embodiments of the present invention.

Extended battery life is achieved by using an accelerometer to bring the unit in and out of a low power mode. When the user is not moving the device (i.e. time delay), the unit automatically goes into a low power or power saving mode. The diode will power down to a nonvisible optical power such as a standby mode. When the user moves the device the original optical power is then returned. An accelerometer may also be used to provide other feedback to the user including, but not limited to, using targeting stability and recoil intensity.

A photodiode is used to sense ambient levels for use with an embedded controller to adjust brightness to the user's eye automatically. The embedded controller remembers brightness levels. The embedded controller is operable to remember the previous setting. The system also includes on-off options for the energy saving and the photodiode. These on-off switches may be provided on the cap 28 of the housing 12.

The assembly further includes a transparent portion or a filter mounted to a top portion of the housing 12. The transparent panel allows the diode and mirror to remain sealed within the housing but provides for the hologram outside of the housing to conserve space. The transparent panel attached to the housing allows the diode and the mirror to be in communication with the hologram 16 allowing light to pass through the transparent portion of the housing. This holographic sight includes the illumination source and the H.O.E. The H.O.E. reconstructs the virtual image of the reticle at a known distance to produce a reconstructed reticle.

H.O.E. Frame and Chassis

Another embodiment is generally related to a frame and/or chassis assembly for holographic weapon sights and a method of making the same. A hologram frame assembly includes a hologram support operable for mounting a display hologram. A holographic optical element (H.O.E.) support is also provided that is operable for mounting a H.O.E. The H.O.E. support is spaced apart from the hologram support. A connector is provided for bridging the hologram support to the H.O.E. support. A reference beam support is included for mounting a reference beam source positioned to allow illumination of the H.O.E. The frame is constructed to align the display hologram and the H.O.E. in relative positions with respect to each other identical to their respective relative positions at the time of their recording. In an example, the frame assembly is fabricated as a single integral unit.

Figure 19:
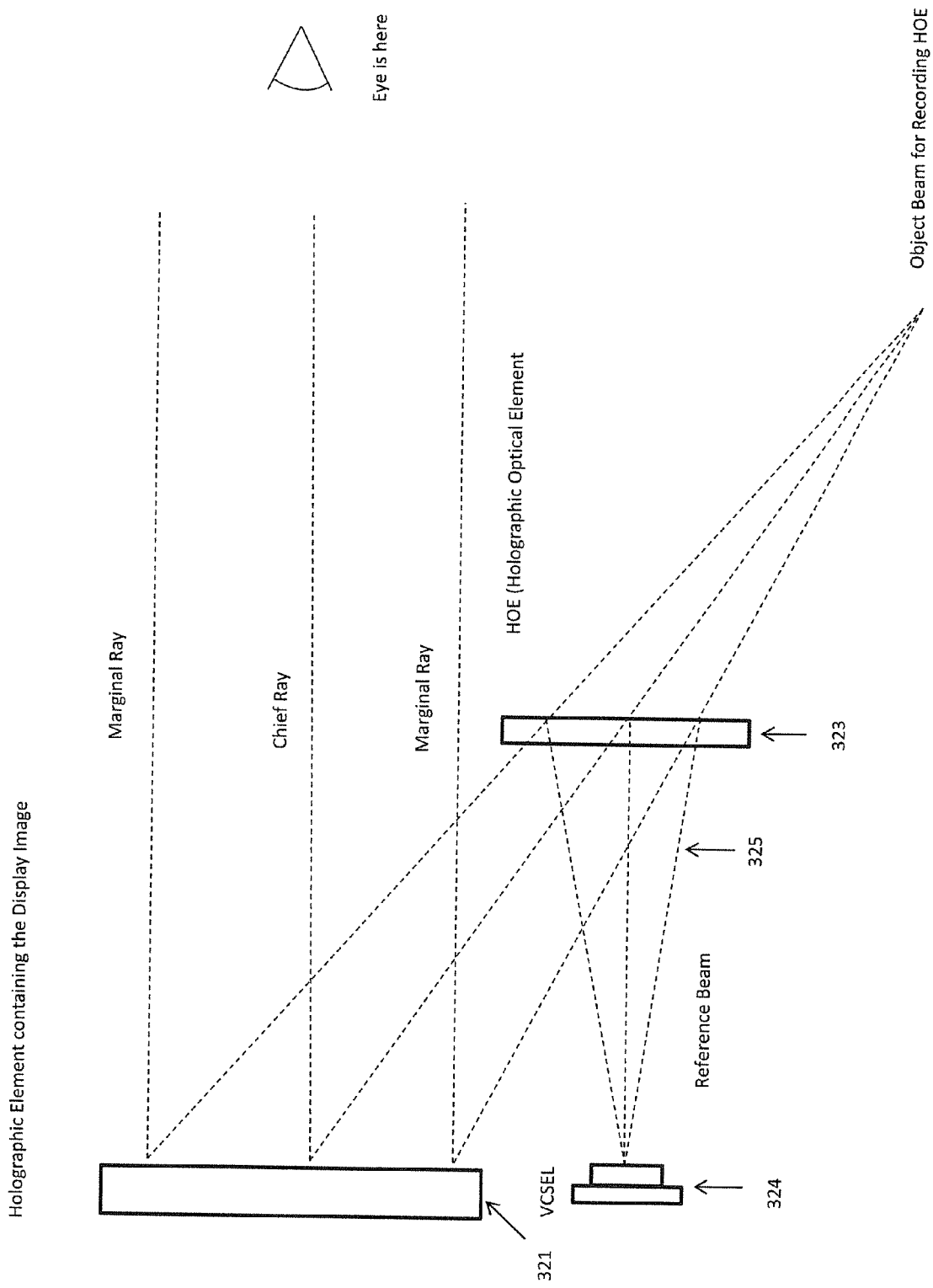
FIG. 19 illustrates a schematic configuration of the H.O.E., stable light source and hologram without a mirror.
Figure 20:
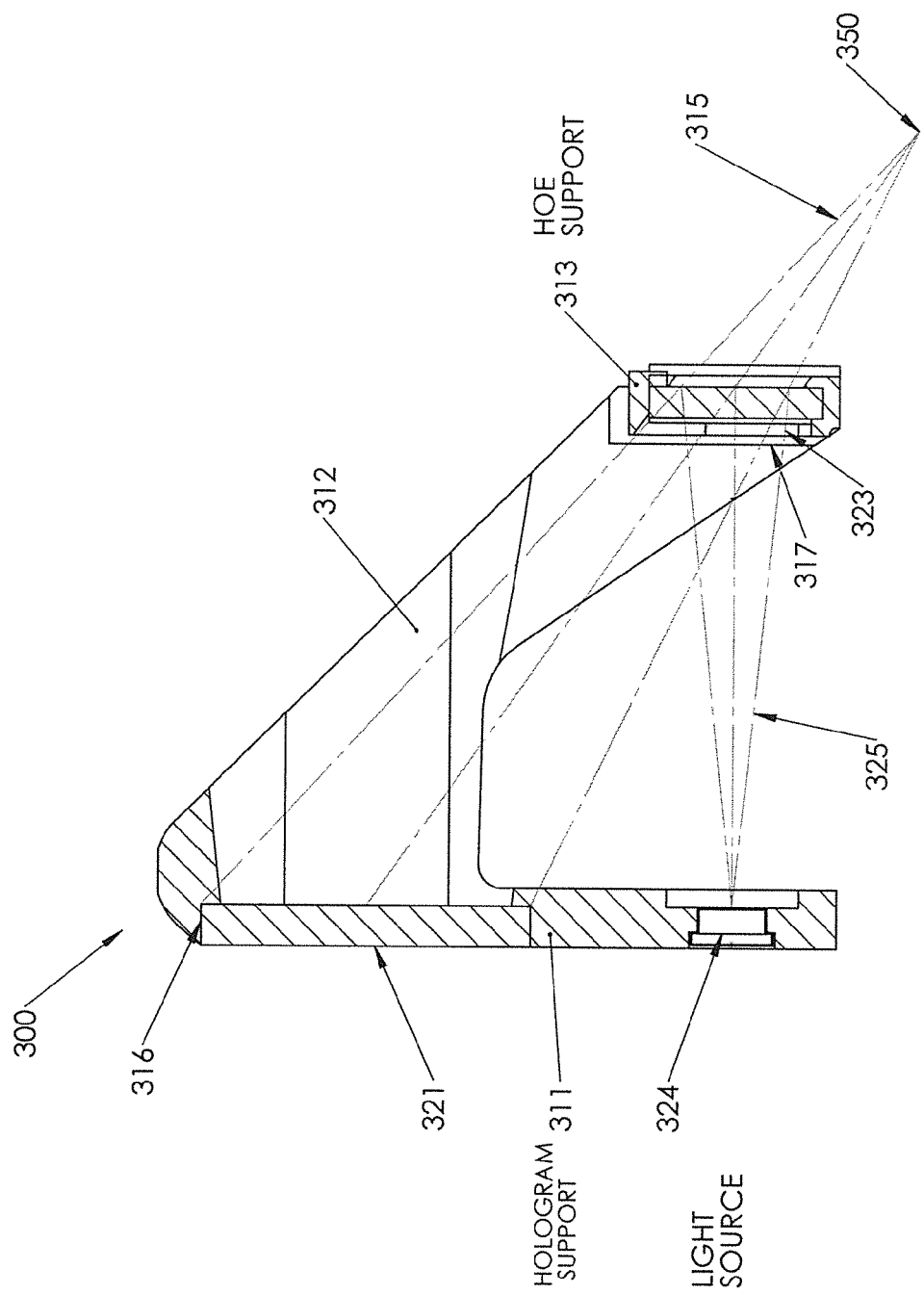
FIG. 20 illustrates a perspective view of the chassis and hologram holder of the present invention.

Referring to FIGS. 19 and 20, the present disclosure provides for a holographic image frame and/or chassis assembly 300 for use with a weapon sight. Assembly 300 is a frame or chassis assembly having a hologram support 311 spaced apart from a H.O.E. support 313. Hologram support 311 and H.O.E. support 313 are physically bridged by a connector 312. Connector 312 maintains the desired spacing of the hologram support 311 from H.O.E. support 313 and maintains the supports in a fixed relationship with respect to each other. In an example, chassis assembly 300 is fabricated as a single integral unit.

In this example, hologram support 311 and H.O.E. support 313 each define a window (316, 317) for mounting and receiving a corresponding image medium (321, 323) respectively. The hologram support 311 defines a hologram window 316 sized and shaped to mount and receive a display hologram 321. In this example, the display hologram 321 and the hologram window 316 define a relatively rectangular or square geometry. Similar to the hologram support 311, the H.O.E. support 313 defines a H.O.E. window 317 sized and shaped to mount and receive a H.O.E. 323. In this example, the display hologram 321 and thus the hologram support 311 is relatively larger than H.O.E. 323 and H.O.E. 313. Accordingly, each of display hologram 321 and H.O.E. 323 can define a face having a surface area wherein the surface area of the display hologram 321 is larger than the surface area of the H.O.E. 323.

Chassis 300 further includes a reference beam support 314 sized and shaped to mount and receive a reference beam source 324. In this example, the reference beam support 314 extends from and is integrally formed with hologram support 311. In an example, the reference beam support 314 can extend downward from hologram support 311 placing reference beam 325 directly below display hologram 321 when chassis 300 is in an upright position or mounted on a weapon. Reference beam source 324 is operable for forming a light beam or reference beam 325. In an example, the reference beam is a laser and in a further example, the reference beam source 324 is a vertical-cavity surface-emitting laser ("VSCEL"). When activated, reference beam source 324 should be positioned to illuminate H.O.E. 323 with the reference beam 325. In an example, chassis 300 is sized and shaped to mount on a hand gun.

Chassis 300 is operable for mounting and receiving a display hologram 321 (also referred to as a hologram 321) and a H.O.E. 323. An H.O.E. refers to an element or object having an image or effect recorded thereon operable to manipulate a wave pattern or beam when illuminated. An H.O.E., for example, can recreate a readout beam in combination with beam expansion. This can allow for having a relatively smaller sized H.O.E. as compared to a display hologram.

In the example of FIGS. 19 and 20, reference beam 325, when activated, illuminates H.O.E. 323 which forms a readout beam 315 to illuminate display hologram 321. When illuminated by the readout beam 315, display hologram 21 displays a reticle image visible at a distance in a viewing field. The reticle image is recorded on the display hologram 321. The readout beam is recorded on the H.O.E. 323. In an example according to the present disclosure, the display hologram 321 and the H.O.E. 323 are recorded in a fixed relationship with respect to each other through the use of the chassis 300.

The recording of display hologram 321 and H.O.E. 323 occurs according to a method of the present disclosure. For recording the elements 321 and 323, reflective imaging is used for recording of the H.O.E. 323 and transmission imaging is used for recording of the display hologram 321. However, it is within the scope of the present disclosure to use reflective/reflective, transmission/reflective, and transmission/transmission imaging configurations.

For recording of the display hologram 321, a recordable medium is mounted and fixed in position of the hologram support window 316. The recordable medium can be any element operable for recording of a hologram image or reticle. In an example, the recordable medium is self-developing photopolymer. Recording a reticle image onto display hologram 321 can include emitting a readout beam and an object beam in the presence of a target image or image mask thereby recording the image onto the display hologram. In one example, hologram 321 can be fabricated from a film material requiring chemical development. In this example, hologram 321 is fabricated from a photopolymer which allows the image to self-develop, thus eliminating the need for costly and hazardous chemical processing.

Once the photopolymer is fixed into position within the hologram support window 16, a readout beam source 350 and a reticle beam source or object beam source (not shown) are positioned into desired alignment. The readout beam source 350 generates a readout beam 315 which records the light and thus the image formed by the object beam source. Often, the object beam source engages an image mask which records a desired image on the recordable medium. For example, cross hairs, a circle, or a single dot can be used as a reticle. Typically, the H.O.E. 323 is recorded following recording of the display hologram 321. However, the present disclosure is not limited to this order of operation.

For recording the H.O.E. 323, a recordable medium such as a photopolymer is mounted and fixed in position of the H.O.E. support window 317. The photopolymer is then exposed to both the readout beam 315 from the readout beam source 350 and the reference beam 325 from the reference beam source 324. This records the readout beam 315 on H.O.E. 323. Accordingly, when chassis 300 is in use and reference beam source 324 is activated, H.O.E. 323 is illuminated by reference beam 325 generating a readout beam 315 which illuminates display hologram 321. Display hologram 321 and H.O.E. 323 are recorded in fixed position with respect to each other and therefore, a desired reticle hologram image is formed. Readout beam 315 is generated using H.O.E. 323 thus eliminating the need for readout beam source 350. In this example, readout beam 315 is an angled beam pattern.

Positioning the reference beam directly aligned below display hologram 321 and spaced apart from H.O.E. 323 allows for more compact assembly. In this example, bridge 312 extends from outer surfaces of the hologram support 311 to the outer surface of H.O.E. support 313 extending in a relatively downward projection. Reference beam source 24 can align directly across from H.O.E. 323. In an example, reference beam 325 is horizontally aligned with H.O.E. 323.

According to the present disclosure, the chassis assembly 300 is operable for mounting onto a small arms weapon. The reference beam source 324 is operable for generating a readout light beam 315 from H.O.E. 323. The display hologram 321 is spaced apart from the H.O.E. 323 to be illuminated by the readout light beam 315. Display hologram 321 includes a target image recorded thereon. The target image is operable to display a perceived reticle image when illuminated by the readout light beam 315. The perceived image is visible at an apparent distance from the assembly 300. Accordingly, a user of the weapon will see a visible reticle, such as a cross hair image, a circle, or a visible dot, and use the hologram as a target or sight.

Display hologram 321 and H.O.E. 323 are fixed in near identical relative position to each other as when recorded. The H.O.E. 323 and the display hologram 321 are fixed on chassis assembly 300. The H.O.E. 323 and display hologram 321 can be positioned in a reflective image orientation as shown in FIG. 12. Alternatively, a transmission image orientation can also be used wherein the direction of the light emitting from the light source is aligned with the direction of the H.O.E. and the readout beam. The present disclosure further provides for a base with an attachment for mounting to an upper surface or rail of a weapon.

The invention is not restricted to the illustrative examples and embodiments described above. The embodiments are not intended as limitations on the scope of the invention. Methods, apparatus, compositions, and the like described herein are exemplary and not intended as limitations on the scope of the invention. Changes therein and other uses will occur to those skilled in the art. The scope of the invention is defined by the scope of the claims.

The invention claimed is:

1. A compact weapon sight, comprising:
a housing having a base configured to mount to a weapon;
a carrier;
a frame fixed with respect to the carrier;
a holographic optical element (H.O.E.), the H.O.E. supported by the frame;
a light source disposed on the carrier and operable to emit a beam of light at an output wavelength when energized, the light source in communication with the H.O.E.;
a power source operable to energize the light source; a sensor for sensing a parameter of the light source;
a control communicating with the sensor, the control operable to control a current from the power source to the light source, the control operable to adjust the current such that the output wavelength is adjusted for a change in the parameter; and
an elevation adjustment mechanism for adjusting the position of the carrier and frame relative to the housing, the elevation adjustment mechanism further comprising;
a shaft supported by the housing and rotatable with respect to the housing;
a first portion of the shaft having a first thread pitch, the first portion of the shaft threaded to a first member, the first member fixedly connected to the housing; and
a second portion of the shaft having a second thread pitch, the second portion threaded to a movable second member, the second member being rotationally fixed with respect to the housing and longitudinally movable with respect to the shaft, the second member connected to the carrier;
wherein the first thread pitch is different from the second thread pitch so as to provide for fine adjustment of the carrier as the shaft rotates.

2. The weapon sight in accordance with claim 1, wherein the sensor is a temperature sensor for sensing a temperature of the light source.

3. The weapon sight in accordance with claim 2, wherein the temperature sensor is a voltage sensor operable to measure the voltage of the light source during an off-period of a duty cycle.

4. The weapon sight in accordance with claim 1, wherein the sensor is a wavelength sensor for sensing a wavelength of the light source.

5. The weapon sight in accordance with claim 4, wherein:
the wavelength sensor is selected from a group of sensor systems consisting of:
a passive dispersion sensor system wherein a beam angle changes a fixed amount based on laser wavelength and the system includes one or more detectors for detecting beam angle changes;
an interference filter system operable to output an optical signal that peaks at a center wavelength and the system includes a sensor for sensing the optical signal;
an active dispersion sensor system wherein a beam angle changes by an adjustable amount based on laser wavelength and the system includes one or more detectors for detecting beam angle changes;
an interferometric sensor system operable to produce wavelength dependent fringes in space or time and the system includes one or more detectors for sensing the wavelength dependent fringes;
a polarization based sensor system operable to produce an output signal that peaks at a center wavelength; and
a semiconductor-based wave meter operable to analyze signal levels from two or more stacked detectors with different spectral responses.

6. The weapon sight in accordance with claim 1, wherein the control controls the current in pulses such that the light source is energized for an on-period and is not energized for an off-period of a duty cycle.

7. The weapon sight in accordance with claim 1, wherein the light source is a vertical-cavity surface emitting laser (VCSEL) diode.

8. The weapon sight in accordance with claim 1, wherein the H.O.E. is a first H.O.E., the sight further comprising a mirror, grating or second H.O.E., the light source illuminating the mirror, grating or second H.O.E. and being reflected or diffracted to illuminate the first H.O.E.

9. The weapon sight in accordance with claim 8, wherein a position of the mirror, grating or second H.O.E. is adjustable.

10. The weapon sight in accordance with claim 1, wherein the beam of light illuminates the H.O.E., the beam of light being a non-collimated diverging beam of light.

11. The weapon sight in accordance with claim 1, wherein the housing includes a chamber having a transparent portion, the light source being sealed within the chamber.

12. The weapon sight in accordance with claim 11, wherein:
the carrier is disposed in the chamber;
the weapon sight further comprising a tie rod at least partially disposed in the chamber, the tie rod defining a tie rod axis along a length of the tie rod, the carrier connected to the tie rod so as to be pivotable about the tie rod axis.

13. The weapon sight in accordance with claim 12, wherein:
the frame supporting the H.O.E. is disposed outside the chamber and connected to a portion of the tie rod extending outside the chamber;
the frame and the carrier both being rotationally fixed to the tie rod such that the light source and H.O.E. rotate together about the axis of the tie rod axis.

14. The weapon sight in accordance with claim 1, wherein the chamber is filled with nitrogen.

15. The weapon sight in accordance with claim 1, further comprising:
a tie rod defining a tie rod axis along a length of the tie rod and supported by the housing for rotation about the tie rod axis, the carrier and the frame both being connected to and rotationally fixed to the tie rod so as to be pivotable about the axis of the tie rod such that the light source and H.O.E. rotate together relative to the housing about the tie rod axis.

16. The weapon sight in accordance with claim 1, wherein:
the beam of light from the light source is a readout light beam having a readout light beam phasefront;
the H.O.E. is a display hologram that reconstructs a reticle when illuminated by the readout light beam, the reconstructed reticle having a perceived distance;
the sight further comprising an adjustable feature operable for adjusting the readout beam phasefront before illumination of the display hologram, wherein adjustment of the adjustable feature varies the perceived distance of the reticle image.

17. The weapon sight in accordance with claim 16, further comprising a movable lens positioned to modify the phasefront of the readout light beam prior to illuminating the display hologram.

18. The weapon sight in accordance with claim 16, further comprising a holographic optical element (H.O.E.) disposed in a position to be illuminated by the light source, the H.O.E. reconstructing an angled readout light beam when illuminated by the light source, the angled readout light beam illuminating the display hologram.

19. The weapon sight in accordance with claim 1, wherein the base of the housing is integral with a weapon.

20. The weapon sight in accordance with claim 1, further comprising an accelerometer connected to the housing adapted to improve battery life of the sight assembly.

21. The sight in accordance with claim 1, wherein the H.O.E. is illuminated by non-collimated light.

22. A compact weapon sight, comprising:
a housing having a base configured to mount to a weapon;
a frame;
a holographic optical element (H.O.E.), the H.O.E. supported by the frame;
a light source operable to emit a beam of light at an output wavelength when energized, the light source in communication with the H.O.E.;
a power source operable to energize the light source; a sensor for sensing a parameter of the light source;
a control communicating with the sensor, the control operable to control a current from the power source to the light source, the control operable to adjust the current such that the output wavelength is adjusted for a change in the parameter; and
a windage adjustment mechanism operable to move the H.O.E. side to side with respect to the housing, the windage adjustment mechanism further comprising;
a shaft supported by the housing and rotatable with respect to the housing;
a first portion of the shaft having a first thread pitch, the first portion of the shaft threaded to a first member, the first member fixedly connected to the housing; and
a second portion of the shaft having a second thread pitch, the second portion threaded to a movable second member, the movable second member being rotationally fixed with respect to the housing and longitudinally movable with respect to the shaft, the second member connected to the frame;
wherein the first thread pitch is different from the second thread pitch so as to provide for fine adjustment of the H.O.E. and frame as the shaft rotates.

23. The weapon sight in accordance with claim 22, wherein the sensor is a temperature sensor for sensing a temperature of the light source.

24. The weapon sight in accordance with claim 23, wherein the temperature sensor is a voltage sensor operable to measure the voltage of the light source during an off-period of a duty cycle.

25. The weapon sight in accordance with claim 22, wherein the sensor is a wavelength sensor for sensing a wavelength of the light source.

26. The weapon sight in accordance with claim 25, wherein:
the wavelength sensor is selected from a group of sensor systems consisting of:
a passive dispersion sensor system wherein a beam angle changes a fixed amount based on laser wavelength and the system includes one or more detectors for detecting beam angle changes;
an interference filter system operable to output an optical signal that peaks at a center wavelength and the system includes a sensor for sensing the optical signal;
an active dispersion sensor system wherein a beam angle changes by an adjustable amount based on laser wavelength and the system includes one or more detectors for detecting beam angle changes;
an interferometric sensor system operable to produce wavelength dependent fringes in space or time and the system includes one or more detectors for sensing the wavelength dependent fringes;
a polarization based sensor system operable to produce an output signal that peaks at a center wavelength; and
a semiconductor-based wave meter operable to analyze signal levels from two or more stacked detectors with different spectral responses.

27. The weapon sight in accordance with claim 22, wherein the control controls the current in pulses such that the light source is energized for an on-period and is not energized for an off-period of a duty cycle.

28. The weapon sight in accordance with claim 22, wherein the light source is a vertical-cavity surface emitting laser (VCSEL) diode.

29. The weapon sight in accordance with claim 22, wherein the H.O.E. is a first H.O.E., the sight further comprising a mirror, grating or second H.O.E., the light source illuminating the mirror, grating or second H.O.E. and being reflected or diffracted to illuminate the first H.O.E.

30. The weapon sight in accordance with claim 29, wherein a position of the mirror, grating or second H.O.E. is adjustable.

31. The weapon sight in accordance with claim 22, wherein the beam of light illuminates the H.O.E., the beam of light being a non-collimated diverging beam of light.

32. The weapon sight in accordance with claim 22, wherein the housing includes a chamber having a transparent portion, the light source being sealed within the chamber.

33. The weapon sight in accordance with claim 32, further comprising:
a carrier disposed in the chamber, the carrier supporting the light source; and
a tie rod at least partially disposed in the chamber, the tie rod defining a tie rod axis along a length of the tie rod, the carrier connected to the tie rod so as to be pivotable about the tie rod axis.

34. The weapon sight in accordance with claim 33, wherein:
the frame supporting the H.O.E. is disposed outside the chamber and connected to a portion of the tie rod extending outside the chamber;
the frame and the carrier both being rotationally fixed to the tie rod such that the light source and H.O.E. rotate together about the tie rod axis.

35. The weapon sight in accordance with claim 32, wherein the chamber is filled with nitrogen.

36. The weapon sight in accordance with claim 22, further comprising:
a tie rod defining a tie rod axis along a length of the tie rod and supported by the housing for rotation about the tie rod axis, the carrier and the frame both being connected to and rotationally fixed to the tie rod so as to be pivotable about the axis of the tie rod such that the light source and H.O.E. rotate together relative to the housing about the tie rod axis.

37. The weapon sight in accordance with claim 22, wherein:
the beam of light from the light source is a readout light beam having a readout light beam phasefront;
the H.O.E. is a display hologram that reconstructs a reticle when illuminated by the readout light beam, the reconstructed reticle having a perceived distance;
the sight further comprising an adjustable feature operable for adjusting the readout beam phasefront before illumination of the display hologram, wherein adjustment of the adjustable feature varies the perceived distance of the reticle image.

38. The weapon sight in accordance with claim 37, further comprising a movable lens positioned to modify the phasefront of the readout light beam prior to illuminating the display hologram.

39. The weapon sight in accordance with claim 37, further comprising a holographic optical element (H.O.E.) disposed in a position to be illuminated by the light source, the H.O.E. reconstructing an angled readout light beam when illuminated by the light source, the angled readout light beam illuminating the display hologram.

40. The weapon sight in accordance with claim 22, wherein the base of the housing is integral with a weapon.

41. The weapon sight in accordance with claim 22, further comprising an accelerometer connected to the housing adapted to improve battery life of the sight assembly.

42. A compact weapon sight, comprising:
a housing having a base configured to mount to a weapon;
a carrier;
a frame fixed with respect to the carrier;
a holographic optical element (H.O.E.), the H.O.E. supported by the frame;
a light source disposed on the carrier and operable to emit a beam of light at an output wavelength when energized, the light source in communication with the H.O.E.;
a power source operable to energize the light source; and
an elevation adjustment mechanism for adjusting the position of the carrier and frame relative to the housing, the elevation adjustment mechanism further comprising;
a shaft supported by the housing and rotatable with respect to the housing;
a first portion of the shaft having a first thread pitch, the first portion of the shaft threaded to a first member, the first member fixedly connected to the housing; and
a second portion of the shaft having a second thread pitch, the second portion threaded to a movable second member, the second member being rotationally fixed with respect to the housing and longitudinally movable with respect to the shaft, the second member connected to the carrier;

wherein the first thread pitch is different from the second thread pitch so as to provide for fine adjustment of the carrier as the shaft rotates.

43. A compact weapon sight, comprising:

a housing having a base configured to mount to a weapon;

a frame;

a holographic optical element (H.O.E.), the H.O.E. supported by the frame;

a light source operable to emit a beam of light at an output wavelength when energized, the light source in communication with the H.O.E.;

a power source operable to energize the light source; and a windage adjustment mechanism operable to move the H.O.E. side to side with respect to the housing, the windage adjustment mechanism further comprising;

a shaft supported by the housing and rotatable with respect to the housing;

a first portion of the shaft having a first thread pitch, the first portion of the shaft threaded to a first member, the first member fixedly connected to the housing; and a second portion of the shaft having a second thread pitch, the second portion threaded to a movable second member, the movable second member being rotationally fixed with respect to the housing and longitudinally movable with respect to the shaft, the second member connected to the frame;

wherein the first thread pitch is different from the second thread pitch so as to provide for fine adjustment of the H.O.E. and frame as the shaft rotates.

* * * * *